United States Patent
Mandlik et al.

(10) Patent No.: US 8,710,518 B2
(45) Date of Patent: Apr. 29, 2014

(54) FLEXIBLE LIGHTING DEVICES

(75) Inventors: Prashant Mandlik, Lawrenceville, NJ (US); Peter Levermore, Belo Horizonte (BR); Huiqing Pang, Newtown, PA (US); Emory Krall, Philadelphia, PA (US); Jason Paynter, Bristol, PA (US); Ruiqing Ma, Morristown, NJ (US)

(73) Assignee: Universal Display Corporation, Ewing, NJ (US)

( * ) Notice: Subject to any disclaimer, the term of this patent is extended or adjusted under 35 U.S.C. 154(b) by 0 days.

(21) Appl. No.: 13/469,992

(22) Filed: May 11, 2012

(65) Prior Publication Data

US 2012/0286302 A1 Nov. 15, 2012

Related U.S. Application Data

(60) Provisional application No. 61/485,243, filed on May 12, 2011.

(51) Int. Cl.
*H01L 51/56* (2006.01)

(52) U.S. Cl.
USPC .. 257/88; 257/40; 257/E27.119; 257/E51.018

(58) Field of Classification Search
USPC ................. 257/40, E51.018, 88, 59, 100, 72, 257/E29.119
See application file for complete search history.

(56) References Cited

U.S. PATENT DOCUMENTS

| | | |
|---|---|---|
| 4,769,292 A | 9/1988 | Tang et al. |
| 5,247,190 A | 9/1993 | Friend et al. |
| 5,703,436 A | 12/1997 | Forrest et al. |
| 5,707,745 A | 1/1998 | Forrest et al. |
| 5,834,893 A | 11/1998 | Bulovic et al. |
| 5,844,363 A | 12/1998 | Gu et al. |
| 6,013,982 A | 1/2000 | Thompson et al. |
| 6,087,196 A | 7/2000 | Sturm et al. |
| 6,091,195 A | 7/2000 | Forrest et al. |
| 6,097,147 A | 8/2000 | Baldo et al. |
| 6,294,398 B1 | 9/2001 | Kim et al. |
| 6,303,238 B1 | 10/2001 | Thompson et al. |
| 6,337,102 B1 | 1/2002 | Forrest et al. |
| 6,468,819 B1 | 10/2002 | Kim et al. |

(Continued)

FOREIGN PATENT DOCUMENTS

| | | |
|---|---|---|
| EP | 2273476 | 12/2011 |
| WO | WO 2009/136305 | 11/2009 |

OTHER PUBLICATIONS

Otani, Takuya, "[FPDI] Samsung Unveils 00.05 mm 'Flapping' OLED Panel", Nikkei Electronics, Oct. 29, 2008.*

(Continued)

*Primary Examiner* — Zandra Smith
*Assistant Examiner* — Paul Patton
(74) *Attorney, Agent, or Firm* — Sterne, Kessler, Goldstein & Fox P.L.L.C.

(57) ABSTRACT

A first device and methods for manufacturing the first device are provided. The first device may comprise a flexible substrate and at least one organic light emitting device (OLED) disposed over the flexible substrate. The first device may have a flexural rigidity between $10^{-1}$ Nm and $10^{-6}$ Nm, and the ratio of the critical strain energy release rate to the material density factor for the first device may be greater than 0.05 J m/Kg.

21 Claims, 14 Drawing Sheets

(56) References Cited

U.S. PATENT DOCUMENTS

| | | | |
|---|---|---|---|
| 6,771,021 | B2 | 8/2004 | Cok |
| 6,787,990 | B2 | 9/2004 | Cok |
| 6,835,950 | B2 * | 12/2004 | Brown et al. .................. 257/40 |
| 6,895,667 | B2 | 5/2005 | Forrest et al. |
| 7,075,226 | B2 | 7/2006 | Cok |
| 7,279,704 | B2 | 10/2007 | Walters et al. |
| 7,431,968 | B1 | 10/2008 | Shtein et al. |
| 7,964,439 | B2 | 6/2011 | Kim et al. |
| 7,968,148 | B2 | 6/2011 | Goh et al. |
| 2003/0230980 | A1 | 12/2003 | Forrest et al. |
| 2004/0174116 | A1 | 9/2004 | Lu et al. |
| 2005/0006642 | A1 * | 1/2005 | Tung et al. .................. 257/40 |
| 2006/0078671 | A1 | 4/2006 | Lee et al. |
| 2006/0169989 | A1 | 8/2006 | Bhattacharya et al. |
| 2007/0069635 | A1 | 3/2007 | Cok |
| 2008/0182109 | A1 | 7/2008 | Hashimoto |
| 2009/0051278 | A1 | 2/2009 | Saneto et al. |
| 2009/0130342 | A1 | 5/2009 | Endo |
| 2011/0073847 | A1 | 3/2011 | Kobayashi et al. |
| 2012/0286245 | A1 | 11/2012 | Levermore |
| 2012/0286649 | A1 | 11/2012 | Rajan |

OTHER PUBLICATIONS

Baldo et al., "Highly Efficient Phosphorescent Emission from Organic Electroluminescent Devices," Nature, vol. 395, 151-154, (1998).

Baldo et al., "Very high-efficiency green organic light-emitting devices based on electrophosphorescence," Appl. Phys. Lett., vol. 75, No. 3, 4-6 (1999).

Pedro Ribeiro, "First-Order Shear Deformation, p-Version, Finite Element for Laminated Plate Nonlinear Vibrations", AIAA Journal, vol. 43, No. 6 (Jun. 2005).

Dr. Gregory M. Odegard, "Introduction to Finite Element Analysis", Michigan Tech, MEEM44055, Spring 2012.

Yijun Liu, Lecture Notes: "Introduction to Finite Element Method", University of Cincinnati (1999).

E. Ventsel and T. Krauthammer, "Thin Plates and Shells: Theory, Analysis, and Applications", pp. 7-8, Marcel Dekker, Inc., New York, New York (2001).

Chang Fo-van, "Bending of Uniformly Cantilever Rectangular Plates, Applied Mathematics and Mechanics", English Edition, vol. 1, No. 3, (1980).

W. Huang and H. Sung, "Three-dimensional simulation of a flapping flag in a uniform flow", J. Fluid Mech, vol. 653, pp. 301-336 (2010).

Takuya Otani: "Samsung unveils 0.05mm "flapping" OLED Panel", Tech On! News portal, Oct. 29, 2008, URL:http://techon.nikkeibp.co.jp/english/ NEWS_EN/20081029/160349/.

Coene, R. "Flutter of slender bodies under axial stress", Appl. Sci. Res. 49, 175-187 (1992).

Zhang, J., Childress, S., Libchaber, A. & Shelley, M. Flexible filaments in a flowing soap film as a model for one-dimensional flags in a two-dimensional wind Nature 408, 835-839 (2000).

W. G. Bickley, "The Heavy Elastica", Phil. Mag. vol. 17 p. 603-622 (Mar. 1934).

H.L. Price, "Techniques for the Measurement of the Flexural Rigidity of Thin Films and Laminates" (Apr. 1966).

BS 3356:1990, British Standard "Method for Determination of Bending Length and Flexural Rigidity of Fabrics", British Standards Institution © 1999.

U.S. Appl. No. 61/485,243, filed May 12, 2011.

International Search Report corresponding to the PCT/US2012/037630 application.

* cited by examiner

Displacement:

$$w = w(x, y), \quad (deflection)$$
$$u = -z \frac{\partial w}{\partial x},$$
$$v = -z \frac{\partial w}{\partial y}.$$

*New independent variables:*

$\theta_x$ and $\theta_y$: rotation angles of a line, which is normal to the mid surface before the deformation, about $x$- and $y$-axis, respectively.

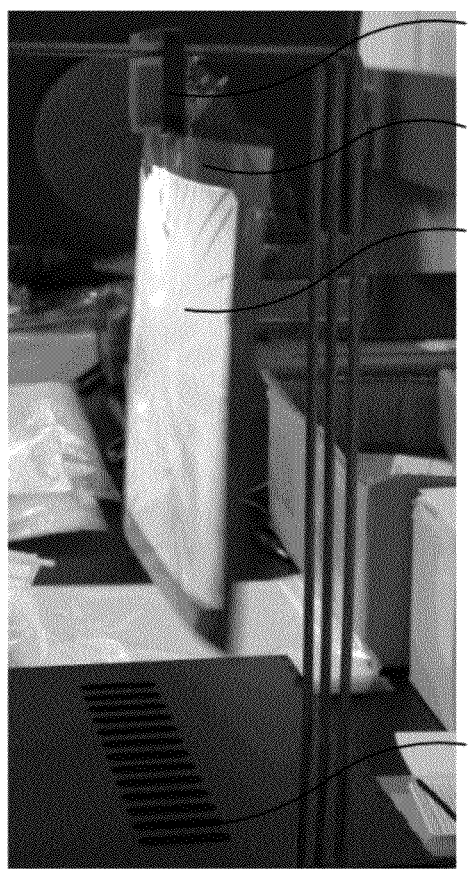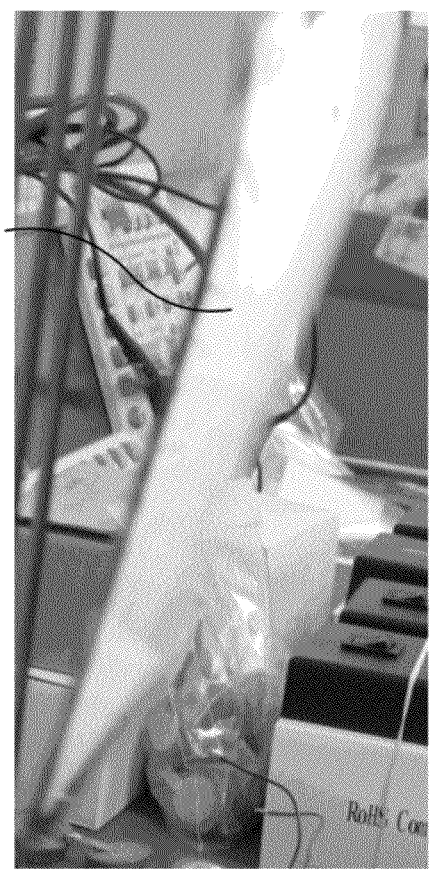
*FIG. 10(a)*  *FIG. 10(b)*

FLEXIBLE LIGHTING DEVICES

CROSS-REFERENCES TO RELATED APPLICATIONS

This application claims benefit under 35 U.S.C. §119(e) of U.S. provisional patent application No. 61/485,243, filed on May 12, 2011, the entire disclosure of which is incorporated herein by reference for all purposes.

The present application also comprises subject matter that may be related to U.S. patent application Ser. No. 13/106,510, filed on May 12, 2011 entitled "Three Dimensional OLED Lamps" and U.S. patent application Ser. No. 13/106,660, filed May 12, 2011, entitled "Dynamic OLED Lighting," each of which is incorporated herein by reference in their entireties.

The claimed invention was made by, on behalf of, and/or in connection with one or more of the following parties to a joint university corporation research agreement: Princeton University, The University of Southern California, The University of Michigan and Universal Display Corporation. The agreement was in effect on and before the date the claimed invention was made, and the claimed invention was made as a result of activities undertaken within the scope of the agreement.

BACKGROUND OF THE INVENTION

Opto-electronic devices that make use of organic materials are becoming increasingly desirable for a number of reasons. Many of the materials used to make such devices are relatively inexpensive, so organic opto-electronic devices have the potential for cost advantages over inorganic devices. In addition, the inherent properties of organic materials, such as their flexibility, may make them well suited for particular applications such as fabrication on a flexible substrate. Examples of organic opto-electronic devices include organic light emitting devices (OLEDs), organic phototransistors, organic photovoltaic cells, and organic photodetectors. For OLEDs, the organic materials may have performance advantages over conventional materials. For example, the wavelength at which an organic emissive layer emits light may generally be readily tuned with appropriate dopants.

OLEDs make use of thin organic films that emit light when voltage is applied across the device. OLEDs are becoming an increasingly interesting technology for use in applications such as flat panel displays, illumination, and backlighting. Several OLED materials and configurations are described in U.S. Pat. Nos. 5,844,363, 6,303,238, and 5,707,745, which are incorporated herein by reference in their entirety.

One application for phosphorescent emissive molecules is a full color display. Industry standards for such a display call for pixels adapted to emit particular colors, referred to as "saturated" colors. In particular, these standards call for saturated red, green, and blue pixels. Color may be measured using CIE coordinates, which are well known to the art.

One example of a green emissive molecule is tris(2-phenylpyridine) iridium, denoted Ir(ppy)3, which has the structure of Formula I:

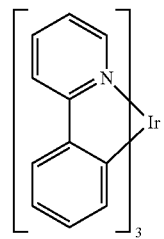

In this, and later figures herein, we depict the dative bond from nitrogen to metal (here, Ir) as a straight line.

As used herein, the term "organic" includes polymeric materials as well as small molecule organic materials that may be used to fabricate organic opto-electronic devices. "Small molecule" refers to any organic material that is not a polymer, and "small molecules" may actually be quite large. Small molecules may include repeat units in some circumstances. For example, using a long chain alkyl group as a substituent does not remove a molecule from the "small molecule" class. Small molecules may also be incorporated into polymers, for example as a pendent group on a polymer backbone or as a part of the backbone. Small molecules may also serve as the core moiety of a dendrimer, which consists of a series of chemical shells built on the core moiety. The core moiety of a dendrimer may be a fluorescent or phosphorescent small molecule emitter. A dendrimer may be a "small molecule," and it is believed that all dendrimers currently used in the field of OLEDs are small molecules.

As used herein, "top" means furthest away from the substrate, while "bottom" means closest to the substrate. Where a first layer is described as "disposed over" a second layer, the first layer is disposed further away from substrate. There may be other layers between the first and second layer, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

As used herein, and as would be generally understood by one skilled in the art, a first "Highest Occupied Molecular Orbital" (HOMO) or "Lowest Unoccupied Molecular Orbital" (LUMO) energy level is "greater than" or "higher than" a second HOMO or LUMO energy level if the first energy level is closer to the vacuum energy level. Since ionization potentials (IP) are measured as a negative energy relative to a vacuum level, a higher HOMO energy level corresponds to an IP having a smaller absolute value (an IP that is less negative). Similarly, a higher LUMO energy level corresponds to an electron affinity (EA) having a smaller absolute value (an EA that is less negative). On a conventional energy level diagram, with the vacuum level at the top, the LUMO energy level of a material is higher than the HOMO energy level of the same material. A "higher" HOMO or LUMO energy level appears closer to the top of such a diagram than a "lower" HOMO or LUMO energy level.

As used herein, and as would be generally understood by one skilled in the art, a first work function is "greater than" or "higher than" a second work function if the first work function has a higher absolute value. Because work functions are generally measured as negative numbers relative to vacuum level, this means that a "higher" work function is more negative. On a conventional energy level diagram, with the vacuum level at the top, a "higher" work function is illustrated as further away from the vacuum level in the downward direction. Thus, the definitions of HOMO and LUMO energy levels follow a different convention than work functions.

More details on OLEDs, and the definitions described above, can be found in U.S. Pat. No. 7,279,704, which is incorporated herein by reference in its entirety.

BRIEF SUMMARY OF THE INVENTION

In some embodiments, a first device may be provided. The first device may comprise a flexible substrate and at least one organic light emitting device (OLED) disposed over the flexible substrate. The first device may have a flexural rigidity between $10^{-1}$ Nm and $10^{-6}$ Nm, and the ratio of the critical strain energy release rate to the material density factor for the first device may be greater than 0.05 J m/Kg.

In some embodiments, in the first device as described above, the ratio of the critical strain energy release rate to the material density factor for the first device may be greater than 0.1 J m/Kg.

In some embodiments, in the first device as described above, the substrate may tolerate a strain of at least 0.5% without breaking.

In some embodiments, in the first device as described above, the flexible substrate may be attached to a fixture via one or more points of attachment, and there may exist a line drawn through the geometric center of the device such that all points of attachment to the fixture fall on the same side of the line.

In some embodiments, in the first device as described above, the flexible substrate may be coupled to a fixture along only one of its edges.

In some embodiments, the first device may comprise a lighting panel or a display.

In some embodiments, in the first device as described above, the substrate may comprise any one of: a plastic material having a thickness between 30 µm and 5 mm; a fabric material having a thickness between 30 µm and 1.6 mm; a metal material having a thickness between 14 µm and 300 µm; or a paper material having a thickness between 30 µm and 1.6 mm.

In some embodiments, in the first device as described above, the substrate may comprise any one of: aluminum sheet having a thickness between 30 µm and 300 µm; stainless steel sheet having a thickness between 20 µm and 150 µm; or copper sheet having a thickness between 25 µm and 250 µm.

In some embodiments, in the first device as described above, the substrate may comprise any one: of polyethylene sheet having a thickness between 200 µm and 2 mm; terephthalate sheet having a thickness between 55 µm and 1 mm; or polyethylene naphthalate sheet having a thickness between 50 µm and 0.72 mm.

In some embodiments, in the first device as described above, the first device may further comprise a barrier layer that encapsulates each of the OLEDs disposed on the substrate. In some embodiments, the barrier layer may comprise a mixture of a polymeric material and non-polymeric material. In some embodiments, the barrier layer may have a thickness of less than 10 microns.

In some embodiments, in the first device as described above, in the first device as described above, each of the one or more OLEDs may comprise a first electrode, a second electrode, and an organic electro-luminescent material disposed between the first electrode and the second electrode. In some embodiments, the first device may comprise a plurality of OLEDs. In some embodiments, the first electrode, the organic electro-luminescent material, and the second electrode of each of the plurality of OLEDs may be patterned. In some embodiments, the organic electro-luminescent material may comprise a blanket layer that is common to each of the OLEDs. In some embodiments, the first electrode of each OLED may comprise a common layer of each of the OLEDs. In some embodiments, where the first electrode of each OLED comprises a common layer of each of the OLEDs, for each of the plurality of OLEDs the first electrode may be disposed over the substrate, the organic electro-luminescent material may be disposed over the first electrode, and the second electrode may be disposed over the electro-luminescent material. In some embodiments, where the first electrode of each OLED comprises a common layer of each of the OLEDs, for each of the plurality of OLEDs the second electrode may be disposed over the substrate, the organic electro-luminescent material may be disposed over the second electrode, and the first electrode may be disposed over the electro-luminescent material.

In some embodiments, in the first device as described above, the first device may have a global-dimension-to-thickness ratio greater than 10. In some embodiments, the first device may have a global-dimension-to-thickness ratio greater than 20. In some embodiments, the first device may have a global-dimension-to-thickness ratio greater than 40. In some embodiments, the first device may have a global-dimension-to-thickness ratio greater than 80.

In some embodiments, in the first device as described above, the OLED may comprise a first electrode and a second electrode, where the first electrode is disposed closer to the substrate than the second electrode. In some embodiments, the first electrode may be in direct contact with the surface of the substrate. In some embodiments, at least one layer may be present between the first electrode of the OLED and the surface of the substrate. In some embodiments, the first device may comprise an insulator disposed between the first electrode of the OLED and the surface of the substrate. In some embodiments, the insulator may comprise a polymer; an inorganic dielectric, or a mixture of both.

In some embodiments, in the first device as described above, the OLED may comprise a single pixel. In some embodiments, in the first device as described above, the OLED may comprise a plurality of pixels. In some embodiments, the plurality of pixels may be connected in series. In some embodiments, the plurality of pixels may be connected in parallel.

In some embodiments, in the first device as described above, the first device may be configured to not have shear degree of freedom.

In some embodiments, in the first device as described above, the first device may be configured to have each of axial, bending, and torsional degrees of freedom.

In some embodiments, in the first device as described above, the first device may be configured to deform non-linearly under an applied load.

In some embodiments, in the first device as described above, the first device may comprise a plurality of OLEDs disposed over the substrate. In some embodiments, each of the OLEDs may comprise an organic layer, where the organic layer of each of the OLEDs may not be a common layer. In some embodiments, each of the OLEDs of the plurality of OLEDs may be individually addressable. In some embodiments, each of the OLEDs of the plurality of OLEDs may be commonly addressable.

In some embodiments, in the first device as described above, the first device may comprise metal foil, plastic, fabric, glass, paper or combinations thereof.

In some embodiments, in the first device as described above, the first device may be configured to flutter. In some embodiments, the first device may comprise a fixture, and the flexible substrate may be coupled to the fixture. In some embodiments, the first device may have a ratio of (hanging length)$^4$/flexural rigidity ($a^4$/D) of at least 0.02 cm$^4$/dynes·cm.

In some embodiments, in the first device as described above, the first device may be configured such that:

$$\frac{\rho}{\rho + c_m} > 1.3Re^{-0.5} + \rho Fr + \tilde{\gamma}k^2.$$

In some embodiments, a first method may be provided. The first method may comprise the steps of providing a substrate having a first surface, disposing the substrate on a carrier, disposing an adhesive layer between at least a portion of the substrate and at least a portion of the carrier, disposing at least one organic light emitting device (OLED) over the first surface of the substrate, after disposing the at least one OLED, disposing a barrier layer over the OLED, and removing the adhesive layer from the substrate, wherein the adhesive layer has an adhesive fracture energy of less than 200 J/m$^2$ when it is removed from the substrate.

In some embodiments, in the first method as described above, a plurality of OLEDs may be disposed over the first surface of the substrate. In some embodiments, the step of disposing the plurality of OLEDs may comprise depositing one or more organic layers through a shadow mask. In some embodiments, the step of disposing each of the plurality of OLEDs further comprises the steps of depositing a first conductive layer of the first surface of the substrate, depositing an electro-luminescent material over the first conductive layer, and depositing a second conductive layer over the electro-luminescent material. In some embodiments, the first conductive layer may be deposited as a blanket layer. In some embodiments, the electro-luminescent material may be deposited as a patterned layer.

In some embodiments, in the first method as described above, the adhesive layer may have a glass transition temperature, and after the adhesive layer is disposed between the substrate and the carrier, the first method may further comprise the step of baking the substrate, the carrier, and the adhesive layer at a temperature that is less than the glass transition temperature of the adhesive layer.

In some embodiments, in the first method as described above where the adhesive layer has a glass transition temperature, before the adhesive layer is disposed between the substrate and the carrier, the method may further comprise the steps of disposing the adhesive layer over a portion of the carrier; and baking the carrier and the adhesive at a temperature that is less than the glass transition temperature of the adhesive layer.

In some embodiments, in the first method as described above, the step of providing the substrate may comprise planarizing the substrate. In some embodiments, the step of planarizing the substrate may comprise any one of depositing a polymer over at least a portion of the first surface of the substrate and then hard baking the substrate, depositing an inorganic dielectric material over at least a portion of the first surface of the substrate, or depositing a mixture of a polymer and an inorganic dielectric material over at least a portion of the first surface of the substrate. In some embodiments, the inorganic dielectric material is deposited using chemical vapor deposition.

In some embodiments, in the first methods as described above, the carrier may have a thermal conductivity of at least 1 W/m/K.

In some embodiments, in the first method as described above, the carrier may comprise any one of, or some combination of: a metal, an alloy, a ceramic, or polymer.

In some embodiments, in the first method as described above, the adhesive layer may have an adhesive fracture energy of less than 100 J/m$^2$.

In some embodiments, in the first method as described above, the step of removing the adhesive layer from the substrate may comprise any one of, or some combination of: applying a force to the substrate; ablating the adhesive layer; exposing the adhesive layer to a solvent, or baking the adhesive.

In some embodiments, in the first method as described above, after the barrier layer is disposed over the OLED, the first method may further comprise the step of disposing a lamination layer over the barrier layer. In some embodiments, the lamination layer may comprise any one of, or some combination of a polymer membrane coupled to the substrate using an adhesive; a polymer layer that is thin spun-on to the barrier film; an evaporated polymer layer; or a spray coated, aerosol dispersed polymer layer disposed over the barrier film.

In some embodiments, a device may be provided. The device may comprise a substrate and one or more OLEDs disposed over the substrate where each OLED may comprise: a first electrode a second electrode; and an electro-luminescent material disposed between the first and second electrodes. The device may further include an encapsulation layer disposed over at least a part of the one or more OLEDs, and a lamination layer disposed over the encapsulation layer, where the lamination layer comprises a spray coating.

In some embodiments, in the device as described above, the spray coating may comprise a scattering film. In some embodiments, the spray coating may comprise an aerosol dispersed polymer layer. In some embodiments, the substrate may be a flexible substrate.

In some embodiments, a method may be provided. The method may comprise the steps of providing a substrate and disposing one or more OLEDs over the substrate, wherein each OLED comprises: a first electrode; a second electrode; and an electro-luminescent material disposed between the first and second electrodes. The method may further include the steps of disposing an encapsulation layer over at least a part of the one or more OLEDs, and disposing a lamination layer over the encapsulation layer, wherein disposing the lamination layer comprises spray coating the lamination layer.

In some embodiments, the lamination layer may comprise a scattering film. In some embodiments, the lamination layer may comprise an aerosol dispersed polymer layer. In some embodiments, the substrate may comprise a flexible substrate.

BRIEF DESCRIPTION OF THE DRAWINGS

FIG. 10(a) is a photograph of an experimental fluttering lighting device fabricated by the inventors in accordance with some embodiments. FIG. 10(b) is a photograph of the exemplary device in FIG. 10(a) deforming in wind.

DETAILED DESCRIPTION OF THE INVENTION

Generally, an OLED comprises at least one organic layer disposed between and electrically connected to an anode and a cathode. When a current is applied, the anode injects holes and the cathode injects electrons into the organic layer(s). The injected holes and electrons each migrate toward the oppositely charged electrode. When an electron and hole localize on the same molecule, an "exciton," which is a localized electron-hole pair having an excited energy state, is formed. Light is emitted when the exciton relaxes via a photoemissive mechanism. In some cases, the exciton may be localized on an excimer or an exciplex. Non-radiative mechanisms, such as thermal relaxation, may also occur, but are generally considered undesirable.

The initial OLEDs used emissive molecules that emitted light from their singlet states ("fluorescence") as disclosed, for example, in U.S. Pat. No. 4,769,292, which is incorporated by reference in its entirety. Fluorescent emission generally occurs in a time frame of less than 10 nanoseconds.

More recently, OLEDs having emissive materials that emit light from triplet states ("phosphorescence") have been demonstrated. Baldo et al., "Highly Efficient Phosphorescent Emission from Organic Electroluminescent Devices," Nature, vol. 395, 151-154, 1998; ("Baldo-I") and Baldo et al., "Very high-efficiency green organic light-emitting devices based on electrophosphorescence," Appl. Phys. Lett., vol. 75, No. 3, 4-6 (1999) ("Baldo-II"), which are incorporated by reference in their entireties. Phosphorescence is described in more detail in U.S. Pat. No. 7,279,704 at cols. 5-6, which are incorporated by reference.

Figure 1:
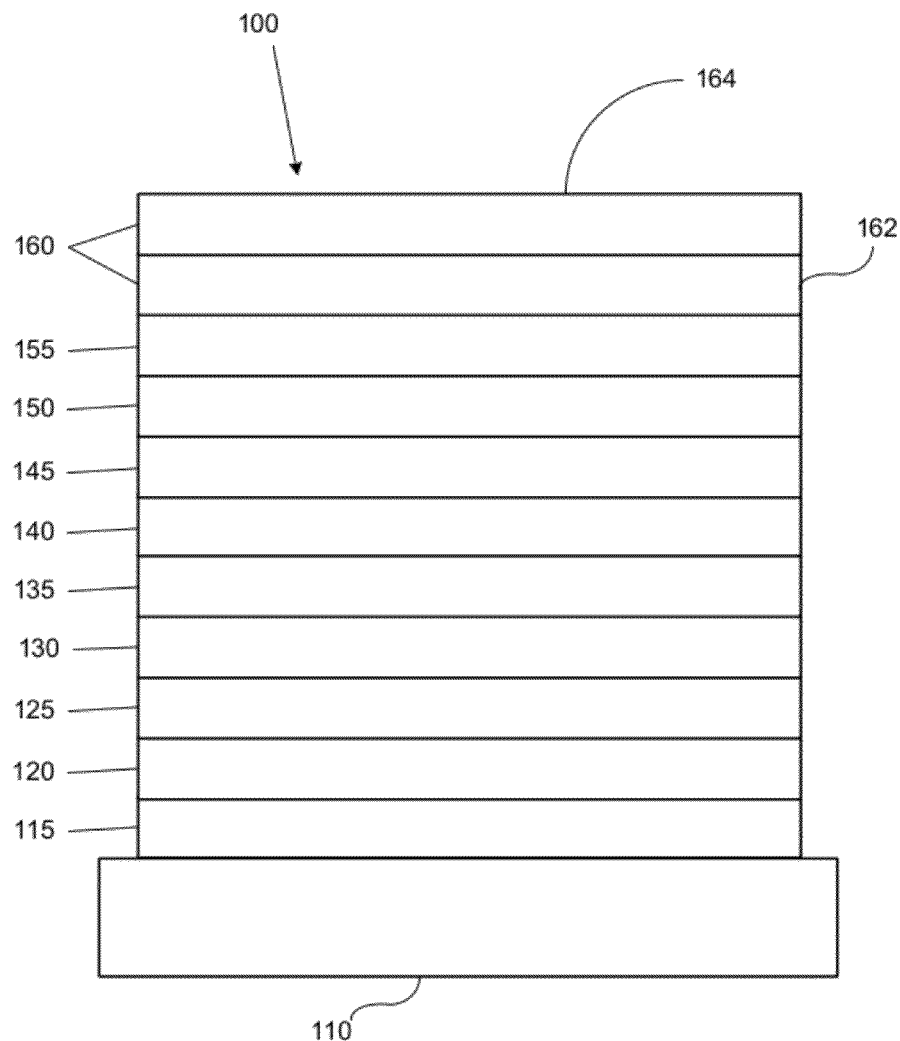
FIG. 1 shows an organic light emitting device.

FIG. 1 shows an organic light emitting device 100. The figures are not necessarily drawn to scale. Device 100 may include a substrate 110, an anode 115, a hole injection layer 120, a hole transport layer 125, an electron blocking layer 130, an emissive layer 135, a hole blocking layer 140, an electron transport layer 145, an electron injection layer 150, a protective layer 155, and a cathode 160. Cathode 160 is a compound cathode having a first conductive layer 162 and a second conductive layer 164. Device 100 may be fabricated by depositing the layers described, in order. The properties and functions of these various layers, as well as example materials, are described in more detail in U.S. Pat. No. 7,279,704 at cols. 6-10, which are incorporated by reference.

More examples for each of these layers are available. For example, a flexible and transparent substrate-anode combination is disclosed in U.S. Pat. No. 5,844,363, which is incorporated by reference in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference in its entirety. Examples of emissive and host materials are disclosed in U.S. Pat. No. 6,303,238 to Thompson et al., which is incorporated by reference in its entirety. An example of an n-doped electron transport layer is BPhen doped with Li at a molar ratio of 1:1, as disclosed in U.S. Patent Application Publication No. 2003/0230980, which is incorporated by reference in its entirety. U.S. Pat. Nos. 5,703,436 and 5,707,745, which are incorporated by reference in their entireties, disclose examples of cathodes including compound cathodes having a thin layer of metal such as Mg:Ag with an overlying transparent, electrically-conductive, sputter-deposited ITO layer. The theory and use of blocking layers is described in more detail in U.S. Pat. No. 6,097,147 and U.S. Patent Application Publication No. 2003/0230980, which are incorporated by reference in their entireties. Examples of injection layers are provided in U.S. Patent Application Publication No. 2004/0174116, which is incorporated by reference in its entirety. A description of protective layers may be found in U.S. Patent Application Publication No. 2004/0174116, which is incorporated by reference in its entirety.

Figure 2:
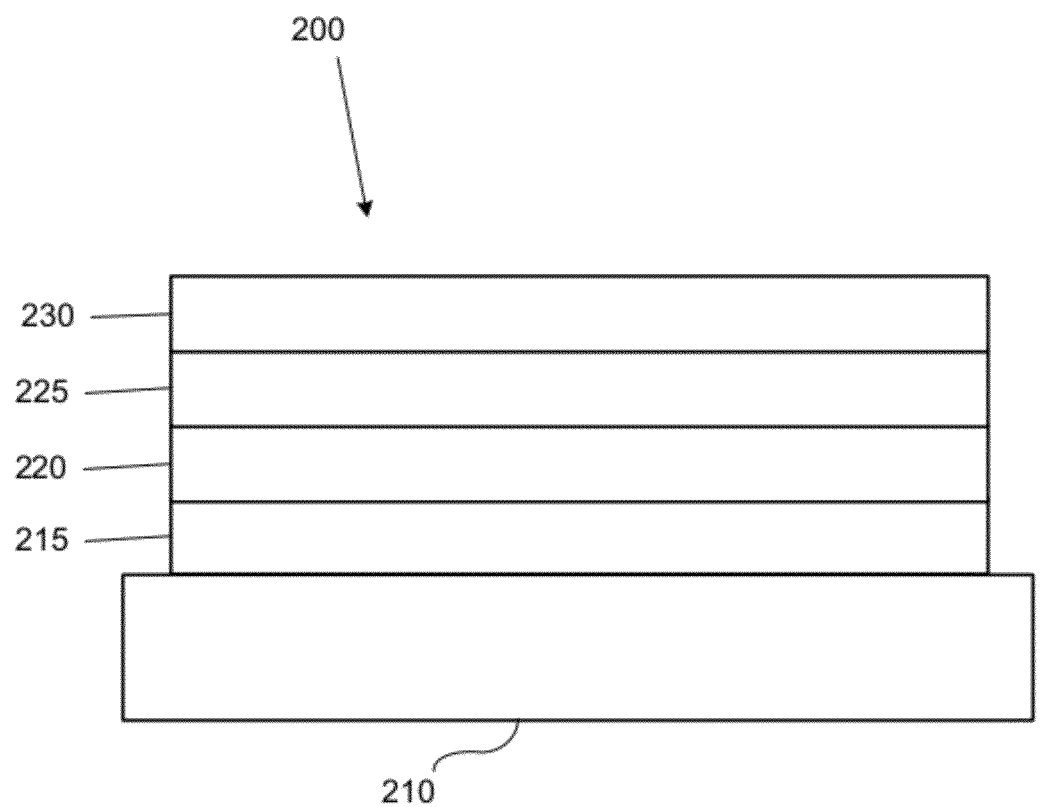
FIG. 2 shows an inverted organic light emitting device that does not have a separate electron transport layer.

FIG. 2 shows an inverted OLED 200. The device includes a substrate 210, a cathode 215, an emissive layer 220, a hole transport layer 225, and an anode 230. Device 200 may be fabricated by depositing the layers described, in order. Because the most common OLED configuration has a cathode disposed over the anode, and device 200 has cathode 215 disposed under anode 230, device 200 may be referred to as an "inverted" OLED. Materials similar to those described with respect to device 100 may be used in the corresponding layers of device 200. FIG. 2 provides one example of how some layers may be omitted from the structure of device 100.

The simple layered structure illustrated in FIGS. 1 and 2 is provided by way of non-limiting example, and it is understood that embodiments of the invention may be used in connection with a wide variety of other structures. The specific materials and structures described are exemplary in nature, and other materials and structures may be used. Functional OLEDs may be achieved by combining the various layers described in different ways, or layers may be omitted entirely, based on design, performance, and cost factors. Other layers not specifically described may also be included. Materials other than those specifically described may be used.

Although many of the examples provided herein describe various layers as comprising a single material, it is understood that combinations of materials, such as a mixture of host and dopant, or more generally a mixture, may be used. Also, the layers may have various sublayers. The names given to the various layers herein are not intended to be strictly limiting. For example, in device 200, hole transport layer 225 transports holes and injects holes into emissive layer 220, and may be described as a hole transport layer or a hole injection layer. In one embodiment, an OLED may be described as having an "organic layer" disposed between a cathode and an anode. This organic layer may comprise a single layer, or may further comprise multiple layers of different organic materials as described, for example, with respect to FIGS. 1 and 2.

Structures and materials not specifically described may also be used, such as OLEDs comprised of polymeric materials (PLEDs) such as disclosed in U.S. Pat. No. 5,247,190 to Friend et al., which is incorporated by reference in its entirety. By way of further example, OLEDs having a single organic layer may be used. OLEDs may be stacked, for example as described in U.S. Pat. No. 5,707,745 to Forrest et al, which is incorporated by reference in its entirety. The OLED structure may deviate from the simple layered structure illustrated in FIGS. 1 and 2. For example, the substrate may include an angled reflective surface to improve out-coupling, such as a mesa structure as described in U.S. Pat. No. 6,091,195 to Forrest et al., and/or a pit structure as described in U.S. Pat. No. 5,834,893 to Bulovic et al., which are incorporated by reference in their entireties.

Unless otherwise specified, any of the layers of the various embodiments may be deposited by any suitable method. For the organic layers, preferred methods include thermal evaporation, ink-jet, such as described in U.S. Pat. Nos. 6,013,982 and 6,087,196, which are incorporated by reference in their entireties, organic vapor phase deposition (OVPD), such as described in U.S. Pat. No. 6,337,102 to Forrest et al., which is incorporated by reference in its entirety, and deposition by organic vapor jet printing (OVJP), such as described in U.S. patent application Ser. No. 10/233,470, which is incorporated by reference in its entirety. Other suitable deposition methods include spin coating and other solution based processes. Solution based processes are preferably carried out in nitrogen or an inert atmosphere. For the other layers, preferred methods include thermal evaporation. Preferred patterning methods include deposition through a mask, cold welding such as described in U.S. Pat. Nos. 6,294,398 and 6,468,819, which are incorporated by reference in their entireties, and patterning associated with some of the deposition methods such as ink-jet and OVJP. Other methods may also be used. The materials to be deposited may be modified to make them compatible with a particular deposition method. For example, substituents such as alkyl and aryl groups, branched or unbranched, and preferably containing at least 3 carbons, may be used in small molecules to enhance their ability to undergo solution processing. Substituents having 20 carbons or more may be used, and 3-20 carbons is a preferred range. Materials with asymmetric structures may have better solution processibility than those having symmetric structures, because asymmetric materials may have a lower tendency to recrystallize. Dendrimer substituents may be used to enhance the ability of small molecules to undergo solution processing.

Devices fabricated in accordance with embodiments of the invention may be incorporated into a wide variety of consumer products, including flat panel displays, computer monitors, televisions, billboards, lights for interior or exterior illumination and/or signaling, heads up displays, fully transparent displays, flexible displays, laser printers, telephones, cell phones, personal digital assistants (PDAs), laptop computers, digital cameras, camcorders, viewfinders, micro-displays, vehicles, a large area wall, theater or stadium screen, lighting fixtures, or a sign. Various control mechanisms may be used to control devices fabricated in accordance with the present invention, including passive matrix and active matrix. Many of the devices are intended for use in a temperature range comfortable to humans, such as 18 degrees C. to 30 degrees C., and more preferably at room temperature (20-25 degrees C.).

The materials and structures described herein may have applications in devices other than OLEDs. For example, other optoelectronic devices such as organic solar cells and organic photodetectors may employ the materials and structures. More generally, organic devices, such as organic transistors, may employ the materials and structures.

The terms halo, halogen, alkyl, cycloalkyl, alkenyl, alkynyl, arylkyl, heterocyclic group, aryl, aromatic group, and heteroaryl are known to the art, and are defined in U.S. Pat. No. 7,279,704 at cols. 31-32, which are incorporated herein by reference.

Some additional terms that may be used herein may be defined or described as follows:

As used herein, the term "blanket layer" may refer to a layer that is common to all of, or substantially all of, the OLEDs on a substrate. A blanket layer may be deposited through a mask that prevents material from depositing around the edges of the substrate (for example, in the area required for encapsulation or in areas requiring electrical contact from an external power supply or video signal). However, the deposition of a blanket layer generally does not involve deposition of materials onto the substrate through a mask that defines features on the substrate (such as individual pixels of one particular color), such as an FMM. In most cases, the mask used does not need to be aligned to a degree of precision that exactly matches the deposition holes with sub-pixel size features on the substrate.

As used herein, the term "commonly addressable" may refer to configurations in which the current in one device (e.g. an OLED) or group of devices cannot be changed without changing the current in another device or group of devices. The current and/or current density supplied to each device or group of devices need not be the same. This may be the case, for instance, when a voltage is applied across a plurality of devices (or groups of devices) that have a different resistance or emissive area, when a resistor is electrically connected in series or in parallel with a device or group of devices that is different from a resistor electrically connected in series or parallel with another device or group of devices, or any other manner of establishing different currents and/or current densities to components within a device. However, once the current is established for one device or group of devices, this also sets the current for the other groups. That is, "commonly addressable" may refer to configurations in which there is essentially a single switch that controls whether the devices are "on" or "off" (i.e. whether the devices are driven by a current). The devices or groups of devices may not thereby be individually activated and/or deactivated. In this regard, the OLEDs may also be dimmed (e.g. by reducing the current supplied to the device or portions thereof), but in such a case, each of the OLEDs are dimmed together. That is, if one OLED is dimmed, each of the other OLEDs is also dimmed, though not necessarily by the same proportion. This may be in contrast to devices or groups of devices that are individually addressable.

As used herein, the term "comprising" is not intended to be limiting, but may be a transitional term synonymous with "including," "containing," or "characterized by." The term "comprising" may thereby be inclusive or open-ended and does not exclude additional, unrecited elements or method steps when used in a claim or describing embodiments. For instance, in describing a method, "comprising" indicates that the claim is open-ended and allows for additional steps. In describing a device, "comprising" may mean that a named element(s) may be essential for an embodiment, but other elements may be added and still form a construct within the scope of a claim or embodiment. In contrast, the transitional phrase "consisting of" excludes any element, step, or ingredient not specified in a claim or when describing an embodiment. This is consistent with the use of the term throughout the specification.

As used herein, the term "deposit" or "depositing" includes any known method of fabricating a layer of an organic device on a first substrate, including VTE, OVJP, OVJD, stamping, ink jet deposition, LITI, LIPS, as well as fabrication (including photolithography) of a layer on a second substrate followed by alignment of the first and second substrates. Stamping (both additive (i.e. cold welding) and subtractive) is described in detail in U.S. Pat. No. 6,294,398, U.S. Pat. No. 6,895,667 and U.S. Pat. No. 7,964,439 each of which is hereby incorporated by reference.

Flexible lighting devices have been described previously, but in most cases (e.g. U.S. Pat. Nos. 6,787,990; 6,771,021; and 7,075,226) they are described as OLEDs fabricated on flexible substrates held in flexed position by rigid supports. However, flexible lighting devices designed in such way to include and preclude pre-defined mechanical deformations held in such a way to have pre-defined mechanical degrees of freedom have not be known or previously described.

Described herein are flexible lighting devices and processes and conditions that, if met, may result in such devices with distinct and pre-determined mechanical characteristics. Conditions are described herein to make a fluttering lighting device which can deform under a steady flow of wind or another such external force. In addition, described herein are flexible lighting devices and conditions that, if met, may enable the fabrication of such devices that, in some instances, can wave like a flag when hoisted (e.g. configured) like one.

Exemplary Embodiment 1

Provided below is a description of a first exemplary embodiment. The first exemplary embodiment may comprise a lighting device that has no shear degree of freedom (or a nominal value), only axial, bending and torsional degrees of freedom. Shear deformation is a characteristic of rigid substrates. This exemplary flexible lighting device is configured (e.g. prepared) so to clearly fall within the mechanically flexible regime.

To further describe the mechanical deformations of this exemplary device, reference will be made to existing plate deformation theories. Again, these descriptions are provided to further illustrate some embodiments.

Plate bending mechanics may be based on the plate dimensions and therefore may affect the ability to use different theories in determining the characteristics of a plate. Currently, there are three basic theories concerning plates and their bending mechanics: thick plate theory, thin plate theory, and membrane theory. Thin plate theory is based on assumptions made by Kirchhoff in 1850. Reissner in 1945 and Mendlin in 1950 modified the theory to extend it to thick plates. In addition, there is also a regime of plate where even membrane theory does not work to adequately describe the plate. For this regime, thin film theory has been proposed to analyze such devices. However, the use of this theory is beyond the scope of the current discussion.

Figure 3:
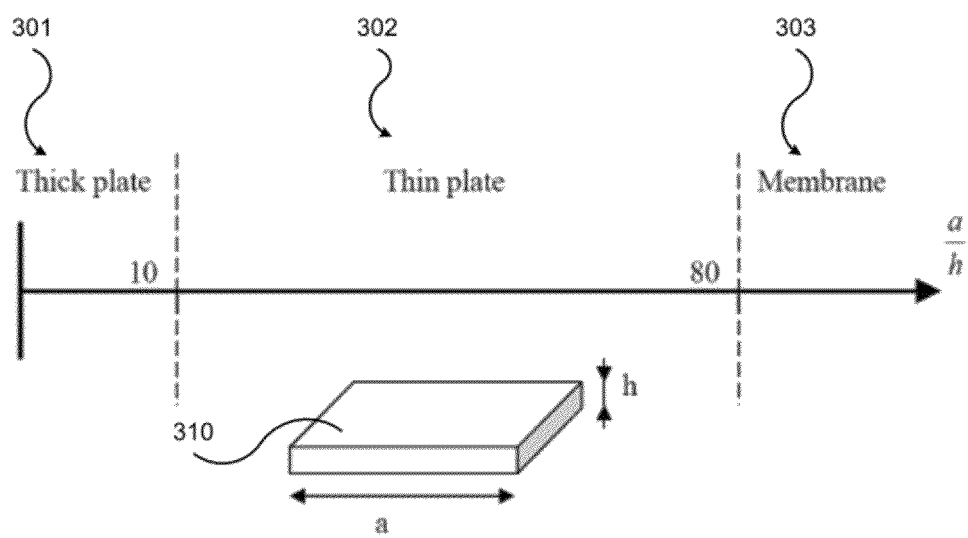
FIG. 3 shows a graphical representation of the categories of thick plate, thin plate, and membrane devices based on the global dimension-to-thickness ratio (a/h).

The factor that decides which theory applies to a particular plate is the global dimension-to-thickness ratio. The "global dimension" of a plate implies distance between supports, or other constructs that give rise to discontinuities. For a cantilever plate (e.g. a plate that may be coupled on one edge to a support) of thickness (h) and length of the overhang (a), the global dimension-to-thickness ratio is a/h. If the ratio is smaller than 10, thick plate theory generally applies. If not, either thin plate or membrane theory may apply. FIG. 3 shows an illustration of the various limits for which these various theories may work. That is, for example, for a plate 310 having a value of global dimension-to-thickness ratio (a/h) less then 10 (corresponding to region 301), thick plate theory may be applied. For a plate 310 having a having a global dimension-to-thickness ratio (a/h) between 10 and 80 (corresponding to region 302), thin plate theory may be applied. Finally, as shown in this example, for a plate 310 having a global dimension-to-thickness ratio (a/h) greater than 80 (corresponding to region 303), membrane theory may be applied.

Using current computational methods, the test have been performed to verify the applicability of thin and thick plate theories. [See, e.g. Pedro Ribeiro, *First-Order Shear Deformation, p-Version, Finite Element for Laminated Plate Nonlinear Vibrations*, AIAA JOURNAL, Vol. 43, No. 6 (June 2005), the entire disclosure of which is incorporated by reference herein]. There is some question as to the limits when membrane theory is applicable to thin but high flexural rigidity analysis. Some tests have been done to prove that membrane theory does not apply very well to thin plates with high rigidity. For small deflections linear mechanics work; however, for large deformations non-linearity is to be taken in account for accurate analysis. [See, e.g., Dr. Gregory M. Odegard, *Introduction to Finite Element Analysis*, Michigan Tech, MEEM4405, the entire disclosure of which is incorporated by reference herein]. This is typically more important when the plate is loaded to lesser degree of freedom, such as when it is clamped on all four edges.

Figure 4:
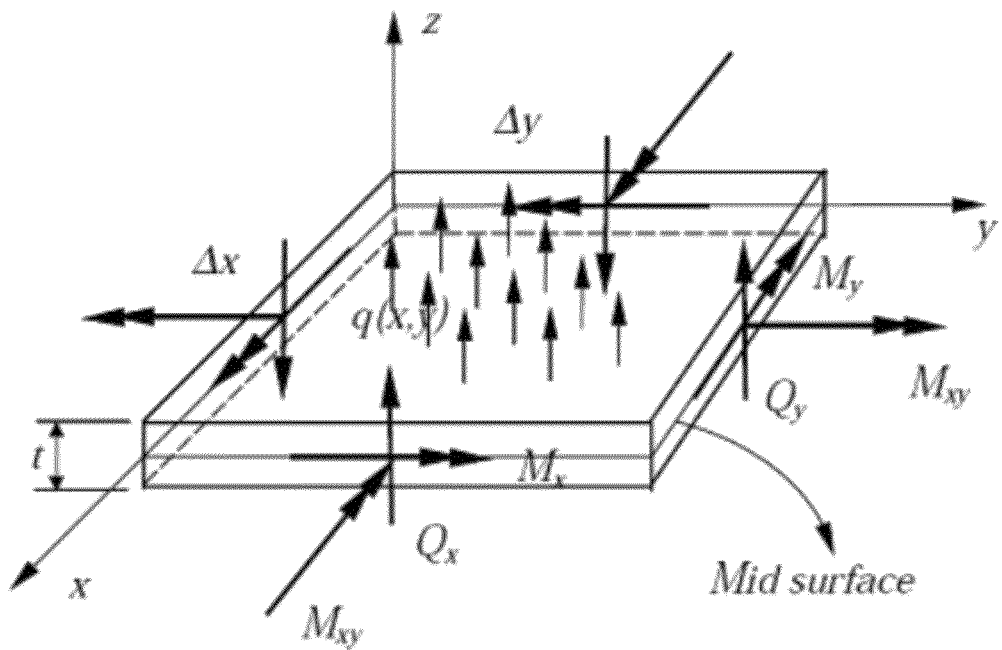
FIG. 4 shows various forces applied on a plate.
Figure 5:
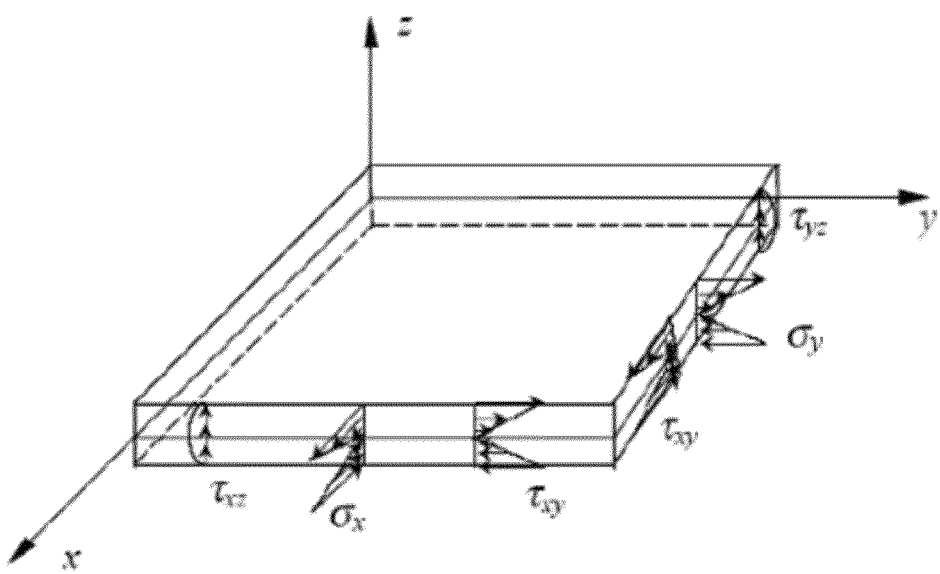
FIG. 5 shows various stresses in a plate subjected to an external force.

Thin plate theory assumes no transverse shear deformation, whereas thick plate theory does take such transverse shear deformation into account. Below is the description of the two formulations for thin and thick plate theories. [See, e.g., Yijun Liu, Lecture Notes: Introduction to Finite Element Method, University of Cincinnati (1999), which is hereby incorporated by reference in its entirety]. FIGS. 4 and 5 show the different forces and stresses resulting from such forces in the thin plate when it is subjected to force, respectively.

The relationship between forces and stresses shown in FIG. 4 will now be described. The bending moments (M) per unit length are general given by:

$$M_x = \int_{-\frac{t}{2}}^{\frac{t}{2}} \sigma_x z \, dz, \ (N \cdot m/m)$$

$$M_y = \int_{-\frac{t}{2}}^{\frac{t}{2}} \sigma_y z \, dz, \ (N \cdot m/m)$$

Where σ is axial stress.

The twisting moment per unit length is given by:

$$M_{xy} = \int_{-\frac{t}{2}}^{\frac{t}{2}} \tau_{xy} z \, dz, \ (N \cdot m/m)$$

Where τ is shear stress. This is shown in FIG. 5.

Shear forces per unit length are given by:

$$Q_x = \int_{-\frac{t}{2}}^{\frac{t}{2}} \tau_{xz} dz, \ (N/m)$$

$$Q_y = \int_{-\frac{t}{2}}^{\frac{t}{2}} \tau_{yz} dz, \ (N/m)$$

These shear forces are labeled accordingly in FIG. 4.

General plate theories will now be described in more detail. It should be noted that such theories are generally understood and known in the art and therefore only some descriptive portions and summaries of such relevant theories will be provided herein for illustration purposes.

Figure 6:
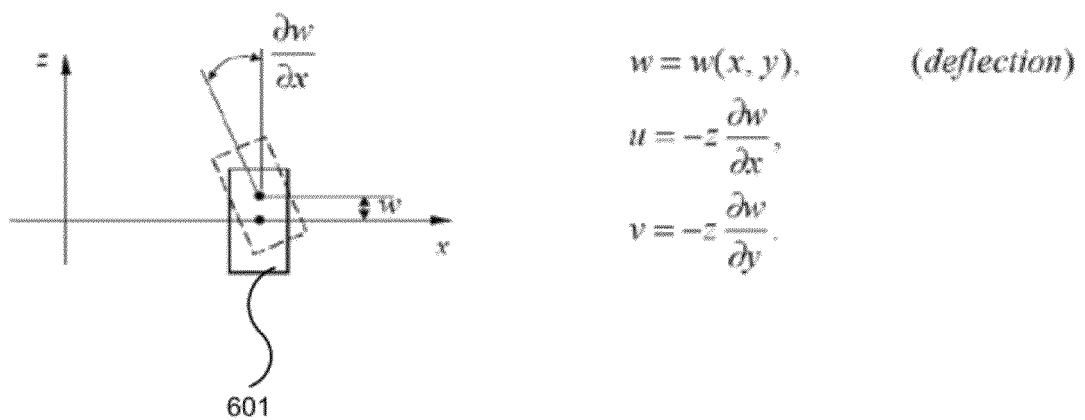
FIG. 6 shows a cross-section of a thin plate bending without undergoing any transverse shear deformation.

Kirchhoff plate theory (or "classical plate theory") has certain assumptions which are previously described in detail [See, e.g. E. Ventsel and T. Krauthammer, *Thin Plates and Shells: Theory, Analysis, and Applications*, pages 7 and 8, Marcel Dekker, Inc., New York, N.Y. (2001), the entire disclosure of which is incorporated herein by reference in its entirety]. An important assumption in classical plate theory is the plate not undergoing any transverse shear deformation. FIG. 6 depicts the cross-section of a plate 601 bending without undergoing any transverse shear deformation. Another important assumption is that the maximum deflection of the plate is less than the plate thickness. Note that in many real world examples, the maximum deflection of the plate may be substantially greater than the plate thickness. In this circumstance non-linear deformation analysis (referring to variation of stress gradient through the plate thickness) is typically required to more accurately describe plate bending. Nevertheless, using the simple model described herein, a reasonably accurate description of plate bending can still be achieved.

Thus, using the simplified model, transverse shear deformations is thereby assumed to be 0:

$$\gamma_{xz} = \gamma_{yz} = 0$$

Given this assumption, the strains associated with the deformation of the plate are given by:

Strains:

$$\varepsilon_x = -z \frac{\partial^2 w}{\partial x^2},$$

$$\varepsilon_y = -z \frac{\partial^2 w}{\partial y^2},$$

Note that there is no stretch of the mid surface due to the deflection (bending) of the plate.

$$\gamma_{xy} = -2z \frac{\partial^2 w}{\partial x \partial y}.$$

Stresses (plane stress state):

$$\begin{Bmatrix} \sigma_x \\ \sigma_y \\ \tau_{xy} \end{Bmatrix} = \frac{E}{1-v^2} \begin{bmatrix} 1 & v & 0 \\ v & 1 & 0 \\ 0 & 0 & (1-v)/2 \end{bmatrix} \begin{Bmatrix} \varepsilon_x \\ \varepsilon_y \\ \gamma_{xy} \end{Bmatrix}$$

or $$\begin{Bmatrix} \sigma_x \\ \sigma_y \\ \tau_{xy} \end{Bmatrix} = -z \frac{E}{1-v^2} \begin{bmatrix} 1 & v & 0 \\ v & 1 & 0 \\ 0 & 0 & (1-v) \end{bmatrix} \begin{Bmatrix} \frac{\partial^2 w}{\partial x^2} \\ \frac{\partial^2 w}{\partial y^2} \\ \frac{\partial^2 w}{\partial x \partial y} \end{Bmatrix}$$

Main variable: deflection $w = w(x, y)$

The equation of deformation of the plate caused by a uniform force is given by:

Governing Equation: $D \nabla^4 w = q(x \cdot y)$

Where, $$\nabla^4 \equiv \left( \frac{\partial^4}{\partial x^4} + 2 \frac{\partial^4}{\partial x^2 \partial y^2} + \frac{\partial^4}{\partial y^4} \right).$$

$$D = \frac{Et^3}{12(1-v^2)}$$

(the bending rigidity of the plate).

q=lateral distributed load (force/area).

Compare the 1-D equation for straight beam:

$$EI \frac{d^4 w}{dx^4} = q(x)$$

Shear forces and bending moments:

$$Q_x = \frac{\partial M_x}{\partial x} + \frac{\partial M_{xy}}{\partial y}, \quad Q_y = \frac{\partial M_{xy}}{\partial x} + \frac{\partial M_y}{\partial y},$$

$$M_x = D \left( \frac{\partial^2 w}{\partial x^2} + v \frac{\partial^2 w}{\partial y^2} \right), \quad M_x = D \left( \frac{\partial^2 w}{\partial y^2} + v \frac{\partial^2 w}{\partial x^2} \right).$$

Solving these equations for different boundary conditions can provide the deformation characteristics for thin plates. It should be noted that, in reality, there is some shear deformation, howsoever small, even for thin plates. However, it may typically be assumed for simplicity that the shear deformation for devices is zero if it is less than 1/50 times the bending deformation.

Figure 7:
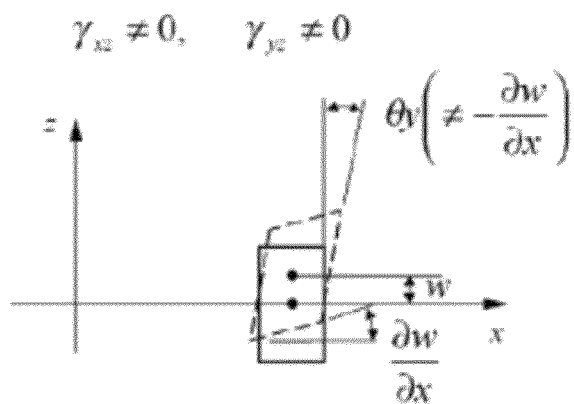
FIG. 7 shows a cross-section of a thick plate bending with transverse shear deformation.

In contrast to the above, plates in which shear deformations cannot be ignored (i.e. where it cannot be assumed that $\gamma_{xz} = \gamma_{yz} = 0$) are called thick plates. As noted above with reference to FIG. 3, such plates usually have a global-dimension-to-thickness value that is less than 10. In this regard, FIG. 7 shows the cross-section of a thick plate undergoing transverse shear deformation when subjected to bending. For such plates, thick plate theory or "Mindlin plate theory" applies.

Therefore, for thick plates, the calculations should include transverse shear deformations as described below:

$$u = z\theta_y,$$

$$\varepsilon_x = z\frac{\partial \theta_y}{\partial x},$$

$$\varepsilon_y = -z\frac{\partial \theta_x}{\partial y},$$

$$\gamma_{xy} = z\left(\frac{\partial \theta_y}{\partial y} - \frac{\partial \theta_x}{\partial x}\right).$$

$$\gamma_{xz} = \frac{\partial w}{\partial x} + \theta_y,$$

$$\gamma_{yz} = \frac{\partial w}{\partial y} - \theta_x.$$

$$v = -z\theta_x:$$

Note that if we imposed the conditions (or assumptions) that $$\gamma_{xz} = \frac{\partial w}{\partial x} + \theta_y = 0.$$

$$\gamma_{yz} = \frac{\partial w}{\partial y} - \theta_x = 0,$$

then we can recover the relations applied in the thin plate theory.

Main variables:

$w(x, y)$, $\theta_x(x, y)$ and $\theta_y(x, y)$

Again solving these equations in combination with the governing equations described for thin plates can provide the deformation behavior of thick plates.

As noted above, the two approaches for thin plates and thick plates are well accepted and have been utilized to study plate mechanics for sometime. These theories have been repeatedly subjected to various tests and it has been found that thin plate theory, in which transverse shear deformation is neglected, is indeed valid for plates with global-dimension-to-thickness ratio greater than 10, in most cases.

The first exemplary embodiment provided may comprise a lighting device prepared on a flexible substrate that is designed such that it undergoes minimal shear deformations when it is bent under its own weight or by application of an external force. The exemplary device may thereby have a global-dimension-to-thickness ratio greater than 10, thereby enabling it to undergo mechanical deformations with negligible shear deformation. This implies out of axial, bending, torsional, and shear degrees of freedom (DOF), this lighting device does not have shear DOF (or such DOF is negligible).

In certain cases, the exemplary device may have global-dimension-to-thickness ratio greater than 80, making membrane-like in-plane forces dominant in the device. Such devices would undergo bending deformation much more readily than extensional deformation under its own weight or under the application of external force (bending, extensional, or torsional). Such a device, for all practical purposes, would deform non-linearly under an applied load.

Exemplary Embodiment 2

The second exemplary embodiment provided herein may comprise a lighting device that is held in a fixture (or coupled to a fixture) and is designed to undergo only certain types of mechanical deformations when subjected to external force. Such external force may be, for example, the flow of air (such as the wind). These deformations are typically large enough to be visible to human eye (such as a waving flag). A "fixture" may refer to any device or support structure to which the lighting device (such as an OLED) may be coupled to.

To understand the deformation behavior of such a lighting device, the example of wind and the force it exerts on a plate held perpendicular to it will be examined. This is provided for illustration purposes only, and is not intended to be limiting. In addition, the effect of a uniform external force (such as wind) on a cantilevered plate will also be considered below.

In general, when an object faces a fluid in motion, it experiences a drag force. This drag force ($F_D$) is given by:

$$F_D = -\frac{1}{2}\rho \times A \times C_d \times v \cdot v \times \frac{v}{\|v\|}$$

Where $F_D$ is the drag force, $\rho$ is the density of the fluid, $v$ is the velocity of the object relative to the fluid, A is the orthographic projection of the object on a plane perpendicular to the direction of motion, and $C_d$ is the drag coefficient. The drag coefficient for flat plates is 1.28 for a 3-D plate, and 2.0 for a 2-D plate when oriented perpendicular to the flow of the fluid.

Continuing with this example, the approximation of the maximum wind force per unit perpendicular object area under normal room conditions and assuming a wind speed of 5.0 mph and $C_d$=1.28 (i.e. for a 3-D plate) is:

$$F_D/A = 3.84 \text{N/m}^2$$

Figure 8:
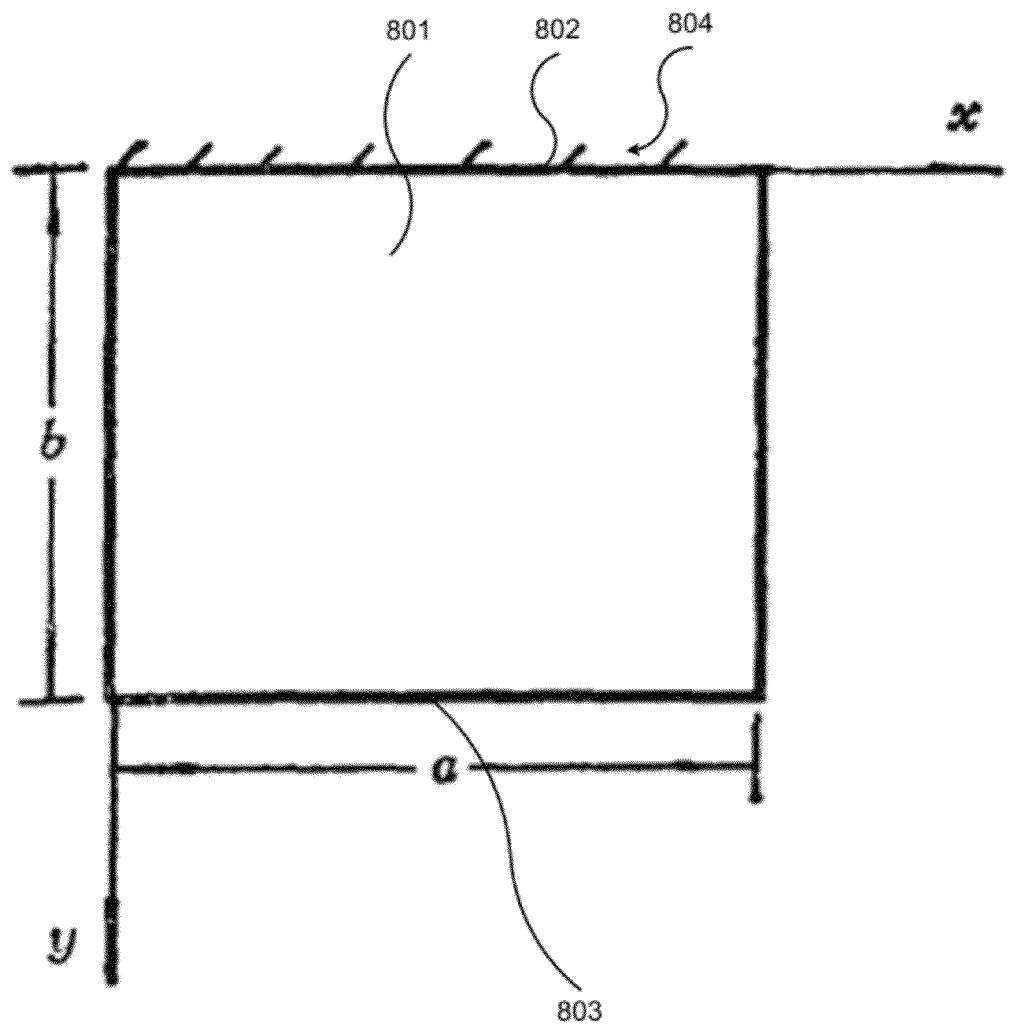
FIG. 8 shows a cantilevered plate coupled (e.g. clamed) along its edge to a fixture at the location designated by y=0.

A plate cantilevered at one edge (i.e. coupled to a fixture on one end, but free to move otherwise) would deflect under the action of a uniform force. FIG. 8 shows the diagram of such a plate 801. The calculations and details describing such action are generally known and described, and would be appreciated by one of skill in the art. [See, e.g., Chang Fo-van, *Bending of Uniformly Cantilever Rectangular Plates*, Applied Mathematics and Mechanics, English Edition, Vol. 1, No. 3, (1980), which is incorporated herein by reference in its entirety].

From the analysis done in the aforementioned reference, and that would otherwise be appreciated by a person of ordinary skill in the art, the maximum deflection of a square plate 801 occurs at the middle point 803 of the edge opposite to the clamped edge 802 (i.e. the edge that is coupled to the fixture 804). For a square plate 801 having side of length a, this deflection ($w_{max}$) is given by:

$$w_{max} = 0.13102\frac{qa^4}{D}$$

Where q is the applied uniform force per unit area and D is the flexural rigidity of a plate of thickness h, where the flexural rigidity is given by:

$$D = \frac{Eh^3}{12(1-v^2)}$$

For a force of 3.84 N/m² or 38.4 dynes/cm² corresponding to the maximum wind force calculated above, and for a plate

801 that is 100 μm thick, has dimensions of 15.2 cm×15.2 cm, and comprises steel foil, the maximum deflection would be described by:

$$w_{max} = 0.13102 \frac{38.4 \times 15.2^4}{\left(\frac{200 \times 10^{10} \times (100 \times 10^{-4})^3}{12 \times 0.91}\right)}$$

$$= 1.47 \text{ cm}$$

Therefore, a 100 μm thick device comprising steel foil having dimensions 15.2 cm×15.2, which is clamped on one edge (i.e. coupled to a fixture) and that is free on the remaining three edges (i.e. not coupled to a fixture) will have a maximum deflection of about 14.7 mm (at a location on the center of the edge opposite to the clamped edge) for a perpendicular wind of 5 miles/hr (this calculation ignores the effect of gravity for illustration purposes, which would otherwise work to further reduce the deflection). If the effect of gravitational pull is included, for a device comprising steel foil hanging vertically under the effect of gravity, and where the drag force is applied perpendicular to the steel foil, the deflection would reduce to about 0.4 mm.

For the same exemplary device comprising metal foil as described above, a maximum deflection of about 0.5 mm would be expected when a perpendicular wind of 6.25 mph is applied. Assuming the desired deflection of the lighting device is at least 0.5 mm when hanging clamped vertically (such as the device shown in FIG. 9 and described below), for a given wind velocity of 6.25 mph (or another similar uniform force of 60 dynes/cm$^2$) applied perpendicular to the square lighting device, the device should have length$^4$/flexural rigidity ($a^4$/D) ratio that is greater than 0.22 (cm$^4$/dynes·cm). In other words, for a maximum deflection of about 0.5 mm for a hanging lighting device clamped on the top edge, for a given wind velocity of 'x' mph or another similar uniform force of 1.536·x$^2$ dynes/cm$^2$ applied perpendicular to the square device, the device should have (length)$^4$/flexural rigidity ($a^4$/D) ratio greater than 8.59/x$^2$ (cm$^4$/dynes·cm). As used in this context, a lighting device made by using such mechanical design rules may be referred to as a "fluttering device."

For a rectangular lighting device, which is clamped on the short edge (i.e. coupled to a fixture along one of the shorter edges), similar constraints on device dimensions and applied force mentioned above will produce the deflection greater than 0.5 mm. However, for a rectangular lighting device which is clamped on the long edge (i.e. coupled to a fixture alone one of the longer edges), similar constrains on dimension and applied force will produce less than 0.5 mm of deflection. In that case, a factor of three may be considered to cover for large aspect ratio devices, which are clamped on the long edge. For those cases, where the hanging lighting device is clamped on the top edge, for a given wind velocity of 'x' mph or another similar uniform force of 1.536·x$^2$ dynes/cm$^2$ applied perpendicular to the square device, the device may have a (length)$^4$/flexural rigidity ($a^4$/D) ratio greater than 25.7/x$^2$ (cm$^4$/dynes·cm), where a is the hanging length of the rectangular device. A device that meets this criterion may be considered a "fluttering device."

Figure 9:
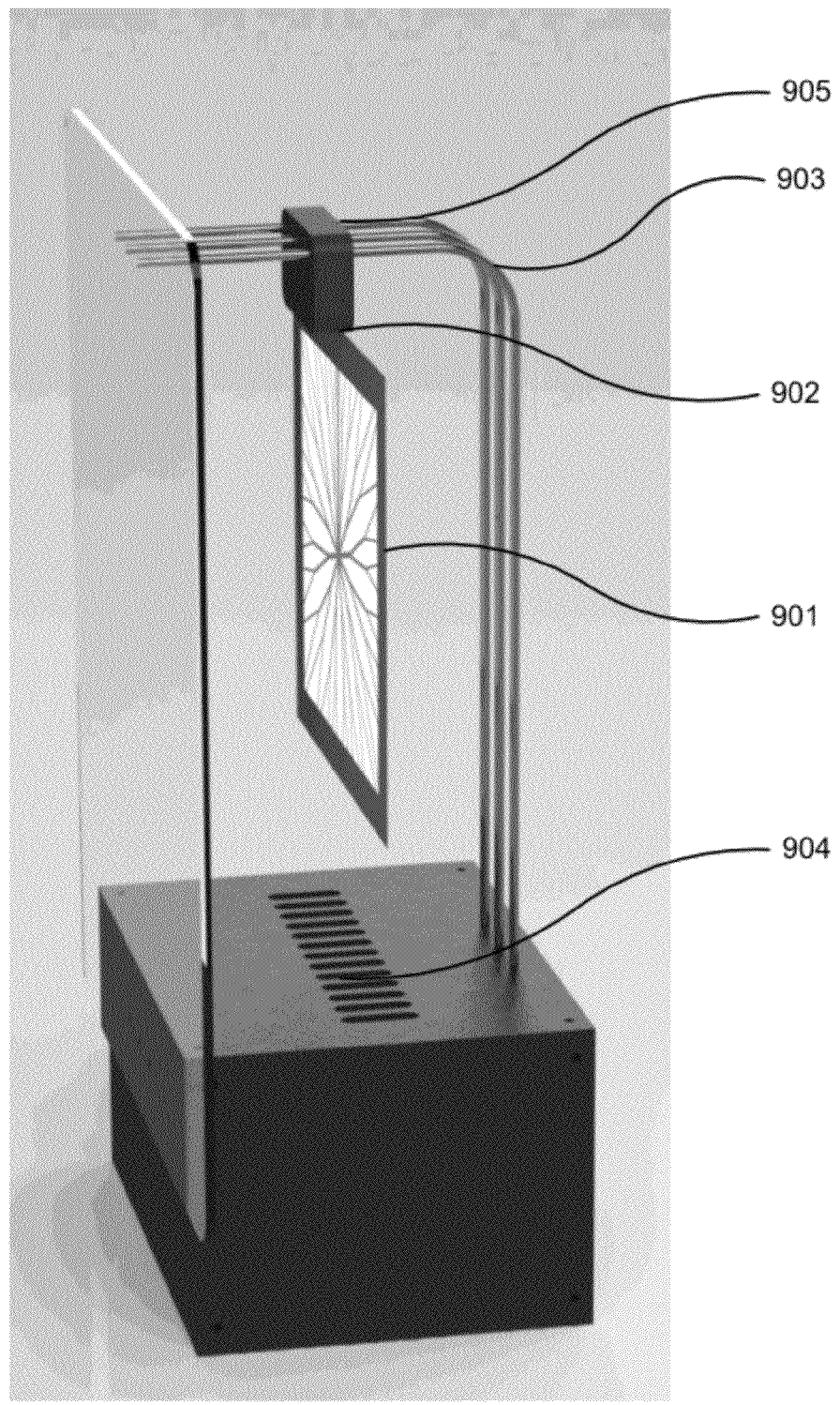
FIG. 9 shows a rendering of an exemplary OLED lighting device with one edge coupled (partly) to a fixture by clamp, while having its remaining edges free in accordance with some embodiments.

FIG. 9 shows a rendering of a fluttering lighting device 901 which is clamped on the top edge 902 to a fixture 903 by a clamp 905. As shown, the exemplary fluttering device 901 is hanging vertically, with three sides that are uncoupled to a fixture. FIGS. 10(a) and (b) are photographs of an actual experimental lighting device 1001 fabricated by the inventors that is clamped at the top edge 1002 to a fixture 1003. The exemplary device 1001 is designed to undergo more than 0.5 mm deflection for a wind speed as low as 1.0 mph or external force of similar magnitude. For this device (which has dimensions 15.2 cm×15.2 cm, comprises a steel foil substrate, and is 30 μm thick) the value of (length)$^4$/flexural rigidity ($a^4$/D)= 10.79, which is approximately 8.59/0.89$^2$ (cm$^4$/dynes·cm). Therefore, this exemplary device 1001 will deflect more than approximately 0.5 mm in a wind of 0.9 mph or equivalent uniform perpendicular force of about 1.22 dynes/cm$^2$.

In the exemplary embodiment 2 described herein, a fluttering lighting device is provided that is clamped (i.e. coupled) on one edge and is left hanging in air with the remaining three edges free. The exemplary device undergoes a deflection of at least 0.5 mm when a perpendicular wind or an equivalent uniform force is applied. For a device in accordance with some embodiments to have a deflection of about 0.5 mm for a given wind velocity of 'x' mph or another similar uniform force of 1.536·x$^2$ dynes/cm$^2$ applied perpendicular to a square or rectangular device, the device should have a value of the ration of (hanging length)$^4$/flexural rigidity ($a^4$/D) that is greater than 25.7/x$^2$ (cm$^4$/dynes·cm).

It should be noted that the force (e.g. an air flow) could be applied directly perpendicular to the plane of the device, or, as shown in FIG. 9 and FIG. 10, parallel to the plane of the device (i.e. air is applied vertically from the vent 904 in FIG. 9 and 1004 in FIG. 10). In the exemplary embodiments shown in FIG. 9 and FIG. 10, it is likely that the parallel air flow from the vents 904 and 1004, respectively, located below the device 901 and 1001, respectively, will induce a small deflection in the device. A component of the parallel air flow will then be perpendicular to the device, and this component may cause a deflection as described above.

Exemplary Embodiment 3

In another exemplary embodiment provided herein, a flexible lighting device which waves in a flag-like motion when it is held with its plane parallel to fluid motion may be provided.

The idea for flag-like lighting device can also be analyzed in similar way using fluid dynamics. As with the fundamentals and analysis of plate deformation described above, the basic concepts and analytical tools for analyzing such motion are generally known to a person of ordinary skill in the art. Provided below is a description of governing equations of such a device prepared so as to undergo flag-like motion when subjected to external forces (such as wind).

Figure 11:
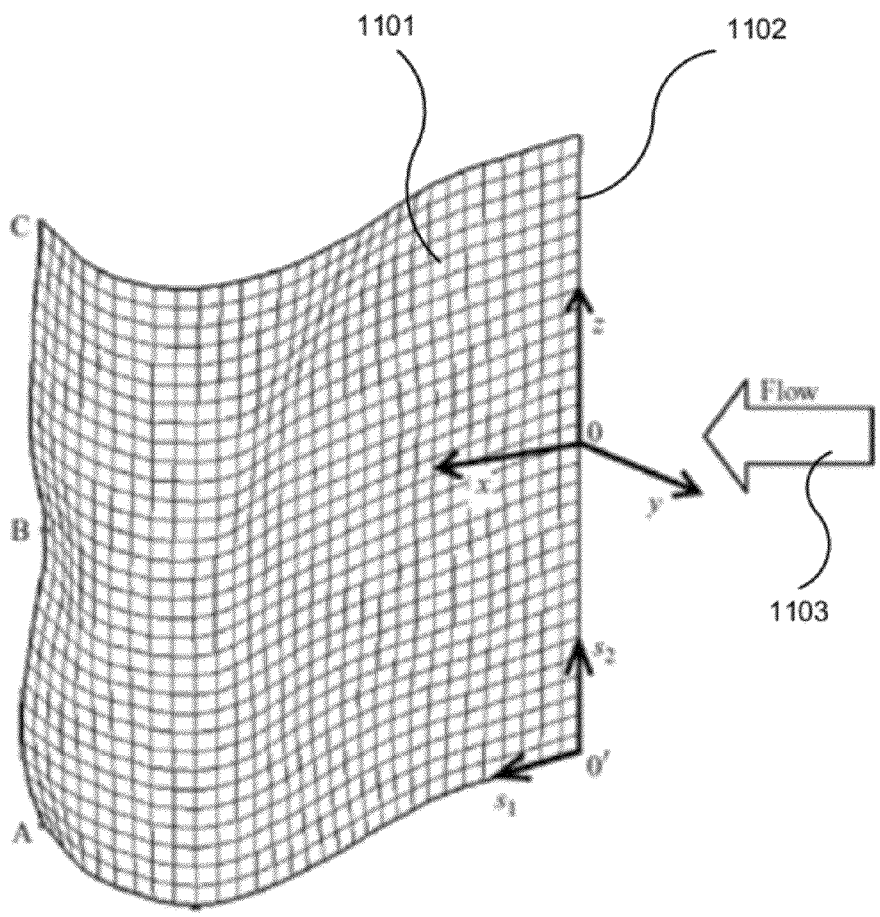
FIG. 11 is a schematic diagram of a flag depicting the orientation of flag with respect to Cartesian coordinates and the direction of flow of fluid.

As noted above, studies have been performed to simulate flag motion in uniform fluid flow. For example, W. Huang and H. Sung, *Three-dimensional simulation of a flapping flag in a uniform flow*, J. Fluid Mech., vol. 653, pp. 301-336 (2010), which is hereby incorporated by reference in its entirety, provides a detailed study of a three-dimensional flag waving in a fluid. FIG. 11 shows such a flag 1101, whose one edge 1102 is fixed (i.e. coupled to a fixture), and fluid is flowing along the plane of the flag (shown by the arrow 1103) and gravity is pulling the flag downward.

According to the analysis performed in the study referenced above by Huang and Sung, the criteria for the occurrence of waving in a flag is given by:

$$\frac{\rho}{\rho + c_m} > \tilde{\sigma} + \tilde{\gamma} k^2, \tag{1}$$

Where $C_m$ (which equals $m_a/\rho_0 L$) is the added mass coefficient, in which $m_a$ is the added mass because of the fluid flow around the device, $\rho_0$ is fluid density, and L is the length of the flag, $$\rho = \frac{\rho_{flag} h}{\rho_0 L}$$

is flag to fluid mass ratio, $\tilde{\sigma}$ is the non-dimensionalized tension force, $$\tilde{\gamma} = \frac{D}{\rho_0 U_\infty^2 L^3}$$

is non-dimensionalized bending rigidity $$k = \frac{2\pi}{\lambda} L$$

is the non-dimensionalized wavenumber, and in which $\lambda$ is the waving wavelength of the flag.

All the quantities in the equation are made non-dimensional by dividing them by characteristic dimensional scales. The tension force is caused by viscous shear and gravity. Its non-dimensional value is given by $\tilde{\sigma}=1.3\, Re^{-0.5}+\rho Fr$, where $$Re = \frac{\rho_0 U_\infty L}{\mu}$$

is the Reynolds number, in which $\mu$ is the dynamic viscosity of the fluid, $U_\infty$ is the fluid velocity far away from the flag, and $$Fr = \frac{gL}{U_\infty^2}$$

is the Froude number, and in which g is the gravitational constant.

Substituting the value of tension force in inequality (1) above, the condition for flag waving becomes:

$$\frac{\rho}{\rho + c_m} > 1.3\, Re^{-0.5} + \rho Fr + \tilde{\gamma} k^2 \qquad (2)$$

For an infinite waving plate, the added mass coefficient is given by $$c_m = \frac{m_a \rho_0}{L} = \frac{2}{k}.$$

It is related to the non-dimensional wavenumber and the waving mode. [See, e.g. R. Coene, *Flutter of slender bodies under axial stress*, Appl. Sci. Res. 49, 175-187 (1992), which is incorporated herein in its entirety].

Substituting in inequality (2), the equation becomes:

$$\frac{\rho}{\rho + \frac{2}{k}} > 1.3\, Re^{-0.5} + \rho Fr + \tilde{\gamma} k^2 \qquad (3)$$

Which may be rewritten as:

$$\rho > (Fr)\rho^2 + \left(1.3 Re^{-0.5} + \tilde{\gamma} k^2 + \frac{2Fr}{k}\right)\rho + \frac{2.6}{k} Re^{-0.5} + 2\tilde{\gamma} k \qquad (4)$$

The first condition for the solution of the above inequality in order to obtain a minimum critical mass ratio is $$\left(1.3 Re^{-0.5} + \tilde{\gamma} k^2 + \frac{2Fr}{k}\right) < 1.$$

For exemplary purposes only, consider a device comprising a 50 µm (h) thick stainless steel substrate (E=200 GPa), which is 15 cm long (L) kept in air. For a plate $$D = \frac{Eh^3}{12(1-v^2)}.$$

For air $\rho_0=0.0012$ g/cc and $\mu=1.8\times10^{-4}$ g/cm sec. It is known that the waving wavelength for such a device is found to be close to the body length of the device. [See, e.g. J. Zhang, S. Childress, A. Libchaber, & M. Shelley, *Flexible filaments in a flowing soap film as a model for one-dimensional flags in a two-dimensional wind*, Nature 408, p. 835-839 (2000), which is incorporated by reference herein in its entirety]. Therefore, $k=2\pi$. Substituting these values into the equation above results in, the above inequality thus becomes:

$$1.3\left(\frac{0.0012 \times 15 \times U_\infty}{1.8 \times 10^{-4}}\right)^{-0.5} + \left(\frac{200 \times 10^{10} \times (5 \times 10^{-3})^3 \times (2\pi)^2}{12 \times 0.91 \times 0.0012 \times 15^3 \times U_\infty^2}\right) + \left(\frac{2 \times 15 \times 1000}{2\pi \times U_\infty^2}\right) < 1$$

Where all of the units in the above equation are in cgs. This equation may be further reduced to:

$$\frac{0.13}{(U_\infty)^{0.5}} + \frac{2.23 \times 10^5}{U_\infty^2} + \frac{4774}{U_\infty^2} < 1$$

The middle term in above equality is the most prominent term. It is related to rigidity of the flag or flag-like device. In this example, the middle term will be equal to 1 for a wind speed of 10.5 miles/hr. For this wind speed, the first and the last term in the left hand side of the above inequality are 0.0059 and 0.02. This implies that the wind speed in this example would have to be at least 10.5 miles/hr to get a real solution from the inequality shown in (4) for the dimensions of the device comprising a steel foil substrate described above.

Using the above mentioned parameters for the flag, we can also determine if the conditions mentioned above satisfy the inequality (4) above. The density of stainless steel is about 8 g/cc. Therefore, the left hand side of the equality becomes:

$$\rho = \frac{8 \times 5 \times 10^{-3}}{0.0012 \times 15} = 2.22$$

Plugging in the values, the right hand side of the equality becomes:

$$\left(\frac{15 \times 1000}{492^2}\right) \times 2.22^2 + (0.9468 \times 2.22) + 1.8 \times 10^{-3} + 0.29346 = 2.70$$

Thus, a wind of 11 miles/hr will not be capable of waving the exemplary steel foil as a hoisted flag because the inequality is not satisfied.

For a wind velocity of 14 miles/hr (623 cm/sec), the right hand side of the equality becomes:

$$0.033 \times 2.22^2 + (0.507 \times 2.22) + 1.54 \times 10^{-3} + 0.1568 = 1.299$$

For a velocity of 12 miles/hr (537 cm/sec), the right hand side of the equality is:

$$0.052 \times 2.22^2 + (0.7955 \times 2.22) + 1.66 \times 10^{-3} + 0.21 = 2.23$$

Therefore, for this device, the wind speed should be close to 12 miles/hr in order to wave a steel foil hoisted as a flag for dimensions and parameters mentioned above to a wavelength close to its length.

In this exemplary embodiment, a flexible device which waves is provided. The device follows the mechanical inequality described above when left in a fluid flowing parallel to the plane of the device; such that:

$$\frac{\rho}{\rho + c_m} > 1.3 Re^{-0.5} + \rho Fr + \tilde{\gamma}k^2,$$

where $$c_m = \frac{m_a}{\rho_0 L}$$

is added mass coefficient because of the fluid flowing around the device, in which $m_a$ is the added mass, $\rho_0$ is fluid density, and L is the length of the flag, $$\rho = \frac{\rho_{flag} h}{\rho_0 L}$$

is the flag-to-fluid mass ratio;

$$Re = \frac{\rho_0 U_\infty L}{\mu}$$

is the Reynolds number, in which μ is the dynamic viscosity of the fluid, $U_\infty$ is the fluid velocity far away from the flag, and $$Fr = \frac{gL}{U_\infty^2}$$

is the Froude number, in which g is the gravitational constant;

$$\tilde{\gamma} = \frac{D}{\rho_0 U_\infty^2 L^3}$$

is non-dimensionalized bending rigidity, $$k = \frac{2\pi}{\lambda} L$$

is the non-dimensionalized wavenumber, in which λ is the waving wavelength of the flag.

Note that the above description assumes fluid first over the contact point, and then over the flexible device. In the examples shown in FIGS. 9 and 10, an experimental fabricated device is provided where the air flow is first over the flexible device and then over the contact point. Nevertheless, the description above is believed to offer a substantially accurate description of the parameters required to cause a flexible substrate to wave in a flag-like motion.

Exemplary Method of Device Fabrication

In addition to the exemplary devices described above, the inventors have discovered new fabrication methods that may be used to fabricate such devices (or any similar type of device). Provided below is a description of such exemplary methods.

An embodiment of the device fabrication method may be divided into the following steps:
1. Substrate Preparation
2. Substrate Mounting
3. OLED Deposition
4. Thin Film Encapsulation
5. Lamination
6. Device Set-Up 1. Substrate Preparation: Flexible substrates could be, for example, thin metal foils (such as Al or stainless steel), plastics (such as PET or PEN), paper, fabric, or composites such as ceramic matrix composites, metal matrix composites, or polymer matrix composites. However, any suitable material may be used. Moreover, substrates could comprise a single material, compound materials, and/or laminated layers.

After obtaining a substrate, the next step in the process may be to planarize the substrate prior to OLED growth. Flexible metal and plastic substrates often suffer from higher asperity count and high rms roughness. Various planarization methods can be used, such as, by way of example only, deposition of a polymer (e.g. polyimide), followed by a hard bake. Another method may be deposition of an inorganic dielectric using methods such as PECVD. The planarization layer may also remove electrical contact between the OLED and the substrate. This may be particularly important in the case of metal foils, where in some circumstances it may be advantageous not to have electrical contact between the substrate and the electrode disposed upon. The planarization layer may also act as a permeation barrier, which is particularly important in the case of plastic substrates, where oxygen and moisture can permeate through the substrate.

In the experimental embodiments comprising a "fluttering" lighting device described above with reference to FIGS.

10(a) and (b), the inventors used a 30 micron thick stainless steel foil substrate with a polyimide planarization layer of thickness approximately 10 microns. The polyimide was hard baked at 400° C. prior to deposition of the anode and subsequent OLED layers.

2. Substrate Mounting: In some instances, the next step in the fabrication process may be to mount the planarized substrate (e.g. steel foil) on a thermally conducting carrier before the OLED deposition. In some instances, this step may be done after the OLED deposition, but should generally be done prior to the thin film encapsulation step. The thin film encapsulation process is usually done by energy intensive plasma-enhanced chemical vapor deposition process, in which the substrate temperature can reach up to 100° C., which can damage the lighting device by affecting the organic materials if the heat absorbed by the device is not dissipated.

It should be noted that the maximum temperature of the overall process in the flexible lighting device is generally still much less than the LTPS process for AMOLED fabrication. Thermally conducting carriers can be made of any suitable material including metals or alloys, or can be a ceramic or polymer with sufficient thermal conductivity. For the flexible substrate to make sufficient thermal contact to the thermally conducing carrier, a thermally conducting adhesive may be sandwiched in between the substrate and the carrier (i.e. disposed between the two components). This thermally conducting adhesive itself can form chemical bonds with the lighting device over the duration of the deposition of the OLED layers and the thin film encapsulation. Therefore, in some embodiments, the substrate mounted on the carrier using the thermally conducting adhesive should typically be baked at a temperature that is less than the glass transition temperature of the adhesive. Another method may be to bake the adhesive on the carrier separately and then attach the substrate.

The mounting methods described above is an example of methods that may be used to dissipate heat from the substrate. However, embodiments are not so limited. For example, in some cases the heat may be directly removed from the substrate when the thermal contact between the substrate and the underlying electrode of the thin film encapsulation chamber is relatively good.

3. OLED Deposition: The anode and/or bus lines could then be deposited in any suitable manner, such as by VTE or sputtering through a shadow mask, or blanket deposited and then patterned using photolithography (assuming that a patterned layer, and not a blanket layer is provided for the anode). Examples of anode materials could include IZO, ITO, Al, Ag or combinations thereof. In some embodiments, structurally weakened regions, e.g., cuts or scores, may be present on the substrate prior to OLED growth, so that the finished device may be conformed into 3D shape. Individual anode areas are preferably patterned around any cuts/scores in the substrate.

Examples of bus line materials may include Al, Ag, Au, and/or Cu. In some instances, bus lines may pass over score marks made on the reverse of the substrate. In some examples individual pixel areas are connected in parallel using bus lines, whereas in other examples pixels may be connected in series. In some examples, a single large area pixel could be used.

Figure 12A:
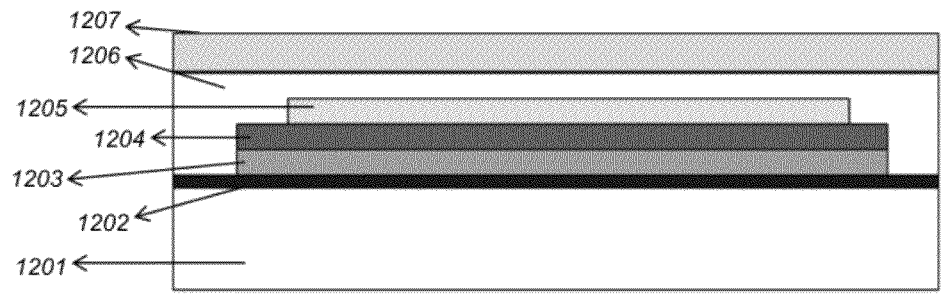
FIG. 12(a) is a schematic diagram of a cross-section of an exemplary OLED having blanket deposited organic layer in accordance with some embodiments.

One exemplary design of a device (such as a lighting panel) which may be more conductive to providing mechanically flexibility is one in which the organic films are deposited not in a blanket large area deposition (i.e. as one or more blanket layers), but using a shadow mask in form of small pixels. Small pixel area deposition of organic materials may leave the thin film encapsulation film to have some metal from the bus line or underlying anode, or the photoresist layer over the bus line, for contact. The adhesion of organic layers to the underlying anode is typically not strong because of the different chemical natures of the anode and the organic layers. Thus, upon flexing the device, the first interfacial delamination is when the thin film encapsulation peels the cathode and the organic layers right off the anode. If the organic layers are large area blanket deposited, the delamination will more readily spread to the entire device relatively quickly. However, if the organic layers are deposited in the form of small, isolated (e.g. physically segmented pixels), a micro-delamination will have to propagate through an entirely different interface, which may require a relatively large amount of energy thereby preventing the spread of a micro-delamination in to a macro-delamination. FIGS. 12(a) and (b) and FIGS. 13(a) and (b) provide a comparison between the effect of island-like (e.g. physically segmented) organic deposition and blanket deposition in relation to the mechanical stability of the lighting device.

Figure 12B:
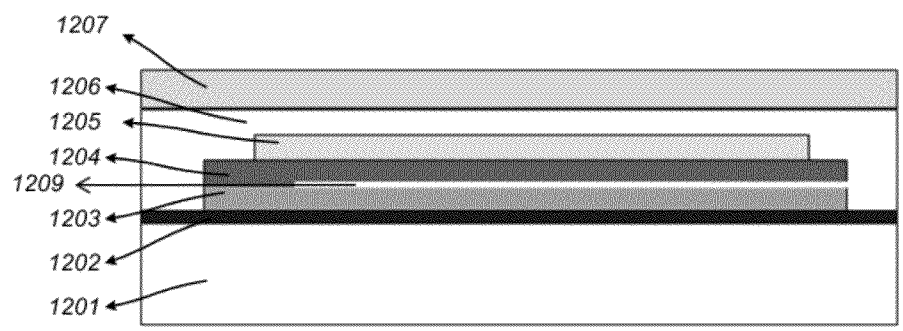
FIG. 12(b) shows the exemplary OLED of FIG. 12(a) after delamination formed that runs across the device.

With reference to FIGS. 12(a) and (b), a lighting device is provided that comprises a substrate 1201, a planarization layer 1202 disposed over the substrate 1201, an anode 1203 deposited as a blanket layer and disposed over the planarization layer 1202, organic layers 1204 deposited as blanket layers over the anode 1203, a cathode 1205 deposited as a blanket layer over the organic layers 1204, a barrier layer 1206 deposited over the device, and a lamination layer 1207 disposed over the barrier layer 1206. This process may be preferred in some applications because it reduced fabrication time and expense because it does not require alignment of one or more shadow masks or the use of a lithography process to form patterned layers. FIG. 12(a) shows the device under normal operating conditions. However, as noted above, because the substrate 1201 is flexible, there is increased force applied to the device, and in particular, to interface and adhesion of the layers of the device. As shown in FIG. 12(b) at 1209, this may results in one or more layers "delaminating" from one another. As noted above, the adhesion between the anode and the organic layers may be relatively weak, and delamination 1209 is more likely to occur. Once the delamination 1209 occurs in one location of the device, and because the organic layer was deposited as a blanket layer, it is more likely to spread across the device. This may effect device performance and/or reduce the lifetime and durability of such devices.

Figure 13A:
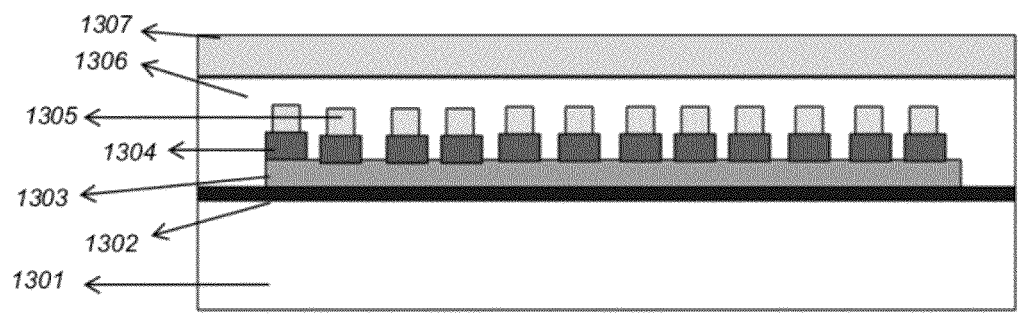
FIG. 13(a) is a schematic diagram of a cross-section of an exemplary OLED having a patterned organic layer in accordance with some embodiments.
Figure 13B:
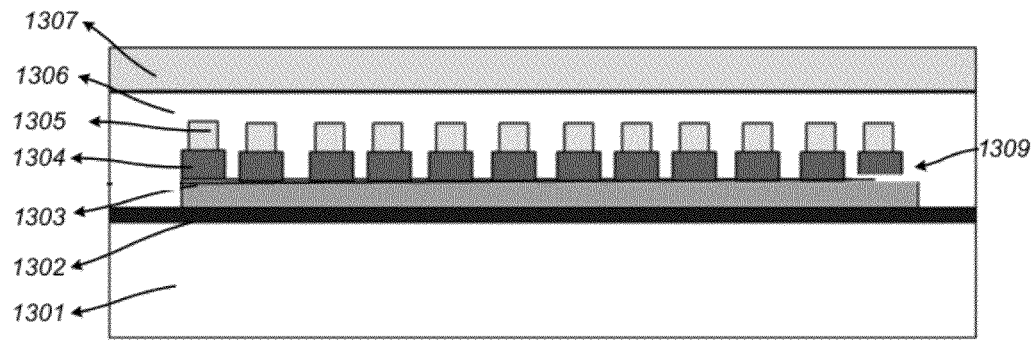
FIG. 13(b) shows the exemplary OLED of FIG. 13(a) after delamination formed that in one of the pixels, but that has not spread to across the device.

FIGS. 13(a) and (b) show a similar device to that of FIGS. 12(a) and (b), except that the organic layers and the cathode have been patterned to form a plurality of physically separate pixels. That is, for example, FIGS. 13(a) and (b) show a device that comprises a substrate 1301, a planarization layer 1302 disposed over the substrate 1301, an anode 1303 deposited as a blanket layer and disposed over the planarization layer 1302, organic layers 1304 deposited as a patterned layer over the anode 1303, to form a plurality of segmented pixels, a cathode 1305 deposited as a patterned layer over the patterned layer of organic material 1304, a barrier layer 1306 deposited over the device, and a lamination layer 1307 disposed over the barrier layer 1306. Although this process may increase fabrication time and expense because it may require alignment of one or more shadow masks and/or the use of a lithography process to form the patterned layers, this embodiment may offer performance and durability advantages because a delamination that occurs at one location of the device may not readily spread to other locations. For example FIG. 13(a) shows the device under normal operating conditions. However, as noted above, because the substrate 1301 is flexible, there is increased force applied to the device, and in particular, to interface and adhesion of the layers of the device. As shown in FIG. 13(b) at 1309, this may results in one or more layers "delaminating" from one another. As noted above, the adhesion between the anode and the organic layers may be relatively weak, and delamination 1309 is more likely to occur at this location. However, unlike the device in FIGS. 12(a) and (b), once the delamination 1309 occurs in one location of the device, it is physically separated from the other portions of the device because of the patterned layers. The encapsulation layer 1306, which may form a better adhesive connection with the anode 1303 separates the next pixel from the delaminated pixel at 1309. In this manner, the additional portions of the active area of the device are less likely to be delaminated and become non-emitting areas (i.e. dead space).

4. Thin Film Encapsulation (TFE): When fabricating an OLED on a flexible substrate, to maintain flexibility, the encapsulation layer should generally also have mechanical flexibility. Thin film encapsulation layers can be inorganic or a combination of inorganic and organic materials. Exemplary films that may be used as an encapsulation layer in some embodiments are provided below in the section entitled "Composition and Fabrication of Exemplary Encapsulation Layer.". The inorganic materials may provide an effective barrier against the permeation of moisture and oxygen, while the organic materials provide mechanical flexibility and help to distribute any faults in the inorganic layers, which may also increase the diffusion path length through the barrier.

In the experimental fluttering lighting device fabricated by the inventors and shown in FIGS. 10(a) and (b), the inventors used PECVD to deposit a TFE layer of thickness less than 10 microns through a shadow mask design. The TFE completely covered the organic material.

5. Lamination: The lamination layer may be the top layer of the device after the encapsulation. It may consist of any suitable material, including, by way of example only, a thin polymer membrane attached to the substrate using an adhesive, a thin spun-on polymer layer, an evaporated polymer layer, or a spray coated, aerosol dispersed polymer layer. The lamination layer may prevent the thin film encapsulation from getting scratched or damaged during handling. The lamination layer may also perform optical function when desired. In the experimental fluttering lighting device fabricated by the inventors and shown in FIGS. 10(a) and 10(b), the lamination layer was an aerosol dispersed polymer film on top of the thin film encapsulation.

6. Device Set-Up: Once the lamination step is complete, the device may be in a condition to be set-up (e.g. positioned to function in an intended application). For example, the experimental embodiment of the fluttering lighting device fabricated by the inventors which is shown in FIGS. 10(a) and (b) was mounted in a fixture after the lamination step. As seen in the representative drawing in FIG. 9 and the corresponding photographs in FIGS. 10(a) and (b), the device 901 was clamped on by the top edge 902 to the fixture 903 (e.g. coupled). The clamp 905 in this embodiment acts as an electrical contact for the device 901. In this particular case, the external force is provided by fans which are located inside the box under the lighting device, which provide air flow through the vents 904. The amount of current flowing through the device 901 can be varied as well as the speed of the fans blowing wind on the device 901.

Additional Exemplary Embodiments

Described below are exemplary embodiments of devices (such as lighting panels) that may be configured to have certain physical properties that may enable predetermined physical deformation and movement based on an externally applied force. For example, some embodiments may flutter when a force is applied perpendicular to a surface of the substrate and/or flap like a flag when a fluid flows substantially parallel to the surface of the substrate. The embodiments described herein are for illustration purposes only and are not thereby intended to be limiting. After reading this disclosure, it may be apparent to a person of ordinary skill in the art that various components and/or features as described below may be combined or omitted in certain embodiments, while still practicing the principles described herein.

In some embodiments, a first device may be provided. The first device may comprise a flexible substrate and at least one organic light emitting device (OLED) disposed over the flexible substrate. The first device may have a flexural rigidity between $10^{-1}$ Nm and $10^{-6}$ Nm, and the ratio of the critical strain energy release rate to the material density factor for the first device may be greater than 0.05 J m/Kg.

As described above, the "flexural rigidity" of a device may refer to the force couple required to bend a rigid structure to a unit curvature. For a uniform substrate, flexural rigidity can be described mathematically as:

$$D=Et^3/12(1-\mu^2) \tag{1}$$

Where D is flexural rigidity (in Nm), E is Young's modulus (in $Nm^{-2}$), $\mu$ is Poisson's ratio and t is the thickness of the substrate (in m). In general, the flexural rigidity, while a characteristic of the entire device, is typically determined predominantly based on the properties of the substrate and the barrier layer. That is, for example, the contributions provided by the electrodes and the organic layers may be neglected for most applications in determining the materials for a device based on a desired flexural rigidity of the device. However, because in some embodiments other components may have an appreciable effect on the flexural rigidity of the device in addition to the substrate, it may be preferred that the flexural rigidity is actually measured. Provided below in the section entitled "Flexural Rigidity Determinations" is a description of exemplary methods and processes that may be used to determine flexural rigidity of a device.

The inventors have discovered that when fabricating lighting devices (such as OLEDs) having particular physical properties that may be related to the flexibility of the device (as well as other variables as described above), the device may be configured to have desired and predetermined reactions to applied forces, such as fluttering or flapping like a flag. In this regard, the inventors have found that such lighting devices that have a flexural rigidity greater than $10^{-1}$ Nm but less than $10^{-6}$ Nm may be both flexible enough to, for instance, bend in response to relatively light forces applied to a surface of the substrate or device, while at the same time have sufficient rigidity that the device may maintain a desired shape and/or have a controlled reaction (such as fluttering or flapping) in response to certain amount of forces.

As used in this context, the "critical strain energy release rate" may refer to a measure of fracture toughness for various materials. However, for some materials (such as thin materials like paper), critical strain energy release rate "per unit sheet density" may be utilized to better identify the overall fracture toughness of the device. The fracture toughness refers to a property which describes the ability of a material containing a crack to resist fracture. As noted above, the first device is flexible and may be subjected to varying forces that may result in micro-cracks developing along the device (e.g. over or along the substrate). The larger the resistance to the development of a fracture from such cracks, the created the potential lifetime of the device.

Some examples of exemplary materials and their corresponding ratio of critical strain energy release rate to material density (in J m/Kg) include the following: Copper (11.2); Brass (7.1); Aluminum base alloys (2.6-39); Steel (0.08-114); PMMA (0.76); PVC (47); Rubber (13); PC (5.6-45); Glass reinforced plastics (normal to fibers) (0.3-3.3); Bond paper (10.5-32); Writing paper (21.4); Aluminum oxide (0.013); Soda-lime glass (0.003). Thus materials like Soda-lime glass may not be preferred or utilized in some embodiments because they are too brittle to adequately function in this flexible application.

In some embodiments, in the first device as described above, the ratio of the critical strain energy release rate to the material density factor for the first device may be greater than 0.1 J m/Kg. In some embodiments, in the first device as described above, the ratio of the critical strain energy release rate to the material density factor for the first device may be greater than 1.0 J m/Kg. As noted above, it may be preferred that this parameter be as a high as possible, while still maintaining an appropriate flexural rigidity so that the device may withstand the stresses of variable forces applied across the device.

In some embodiments, in the first device as described above, the substrate may tolerate a strain of at least 0.5% without breaking. As noted above, the device in some embodiments may experience strain from deformation caused by the application of force.

In some embodiments, in the first device as described above, the flexible substrate may be attached to a fixture via one or more points of attachment, and there may exist a line drawn through the geometric center of the device such that all points of attachment to the fixture fall on the same side of the line. As used in this context, the "geometric center" may refer to the geometric center of the active area of the device. The line may divide the active area into two equal halves. Thus, in this embodiment, the points on which the substrate is coupled to the fixture must be disposed such that there can be some line that is drawn through the geometric center of the light emitting area (i.e. active area) so that each of the coupling points is only on one side.

In some embodiments, in the first device as described above, the flexible substrate may be coupled to a fixture along only one of its edges. As used in this context, an "edge" of the first device may refer to a portion of the first device where a surface that is parallel with the surface of the substrate that the one or more OLEDs are disposed on (or in some embodiments comprises the surface of the substrate itself) meets the outer perimeter of the first device.

In some embodiments, the first device may comprise a lighting panel or a display.

In some embodiments, in the first device as described above, the substrate may comprise any one of a plastic material having a thickness between 30 μm and 5 mm (where the minimum may correspond to a rigid polymer such a Kevlar and the maximum may correspond to a soft polymer such as rubber); a fabric material having a thickness between 30 μm and 1.6 mm (which may correspond to strong fabric materials like flax to weaker material such as cotton) a metal material having a thickness between 14 μm and 300 μm (corresponding to a strong metal such as W to weak metal such as Al); or a paper material having a thickness between 30 μm and 1.6 mm (corresponding to linen paper to cellulose paper).

In some embodiments, in the first device as described above, the substrate may comprise any one of, or some combination of: aluminum sheet having a thickness between 30 μm and 300 μm; stainless steel sheet having a thickness between 20 μm and 150 μm; or copper sheet having a thickness between 25 μm and 250 μm.

In some embodiments, in the first device as described above, the substrate may comprise any one of, or some combination of: polyethylene sheet having a thickness between 200 μm and 2 mm; terephthalate sheet having a thickness between 55 μm and 1 mm; or polyethylene naphthalate sheet having a thickness between 50 μm and 0.72 mm.

In some embodiments, in the first device as described above, the first device may further comprise a barrier layer that encapsulates each of the OLEDs disposed on the substrate. In some embodiments, the barrier layer may comprise a mixture of a polymeric material and non-polymeric material. In some embodiments, the barrier layer may have a thickness of less than 10 microns.

In some embodiments, in the first device as described above, in the first device as described above, each of the one or more OLEDs may comprise a first electrode, a second electrode, and an organic electro-luminescent material disposed between the first electrode and the second electrode. In some embodiments, the first device may comprise a plurality of OLEDs. In some embodiments, the first electrode, the organic electro-luminescent material, and the second electrode of each of the plurality of OLEDs may be patterned. By patterning each of the layers of the OLEDs, embodiments may decrease the likelihood that a delamination between the layers of an OLED in part of the device will spread to one or more of the other OLEDs. For example, an encapsulation layer may be disposed between the patterned layers, which may form a better contact with the substrate or electrode than the organic layers. The encapsulation layer thereby raises the required energy to further delaminate other portions of the device, potentially increasing device performance and lifetime. Exemplary films that may be used as an encapsulation layer in some embodiments are provided below in the section entitled "Composition and Fabrication of Exemplary Encapsulation Layer." In some embodiments, the organic electro-luminescent material may comprise a blanket layer that is common to each of the OLEDs. Although as noted above, patterning one or more layers may provide advantages with regard to delamination, this may also require the additional step of, for instance, deposition through a shadow mask that must be properly aligned. Therefore, it may be preferred that such layers are deposited as a blanket layer to reduce costs. In some embodiments, the first electrode of each OLED may comprise a common layer of each of the OLEDs. In some embodiments, where the first electrode of each OLED comprises a common layer of each of the OLEDs, for each of the plurality of OLEDs the first electrode may be disposed over the substrate, the organic electro-luminescent material may be disposed over the first electrode, and the second electrode may be disposed over the electro-luminescent material. In some embodiments, where the first electrode of each OLED comprises a common layer of each of the OLEDs, for each of the plurality of OLEDs the second electrode may be disposed over the substrate, the organic electro-luminescent material may be disposed over the second electrode, and the first electrode may be disposed over the electro-luminescent material.

In some embodiments, in the first device as described above, the first device may have a global-dimension-to-thickness ratio greater than 10. The term "global dimension" was described above and is applied hereto. In some embodiments, the first device may have a global-dimension-to-thickness ratio greater than 20. In some embodiments, the first device may have a global-dimension-to-thickness ratio greater than 40. In some embodiments, the first device may have a global-dimension-to-thickness ratio greater than 80.

In some embodiments, in the first device as described above, the OLED may comprise a first electrode and a second electrode, where the first electrode is disposed closer to the substrate than the second electrode. In some embodiments, the first electrode may be in direct contact with the surface of the substrate. In some embodiments, at least one layer may be present between the first electrode of the OLED and the surface of the substrate. The layer may be used to planarize the surface of the substrate prior to deposition of the electrode and organic layers of the OLED so as to provide better adhesion and a uniform device appearance. In some embodiments, the first device may comprise an insulator disposed between the first electrode of the OLED and the surface of the substrate. For example, in some embodiments, the substrate may comprise a conductive material (such as metal foil). However, it may be preferred that the substrate is not electrically coupled to the device (e.g. the first electrode) because this configuration could interfere with device performance (e.g. by allowing stray voltage or current such as from an external source to be more readily applied across the device). In some embodiments, the insulator may comprise a polymer, an inorganic dielectric, or some combination or mixture of the two. However, in general, any suitable insulator material may be used.

In some embodiments, in the first device as described above, the OLED may comprise a single pixel. That is, for example, the electrodes and organic layers may be blanket deposited or otherwise be common across the device such that only a single device structure is formed on the panel. In some embodiments, in the first device as described above, the OLED may comprise a plurality of pixels. That is, for example, one or more of the layers of the OLED may be patterned so as to define more than one pixel. However, this does not require that the pixels be individually addressable—for instance, each of the plurality of pixels could be commonly addressable, which may reduce costs of fabrication and reduce the need for electronics to individually control the pixels (or groups of pixels). In some embodiments, the plurality of pixels may be connected in series. In some embodiments, the plurality of pixels may be connected in parallel.

In some embodiments, in the first device as described above, the first device may be configured to not have shear degree of freedom. As used in this context and as noted above, a device may be considered to have no shear degree of freedom where the shear strain is at least 50 times smaller than the bending strain. This is to account for the reality that each device may have a nominal shear degree of freedom, but for most purposes this may be considered zero.

In some embodiments, in the first device as described above, the first device may be configured to have each of axial, bending, and torsional degrees of freedom.

In some embodiments, in the first device as described above, the first device may be configured to deform non-linearly under an applied load.

In some embodiments, in the first device as described above, the first device may comprise a plurality of OLEDs disposed over the substrate. In some embodiments, each of the OLEDs may comprise an organic layer, where the organic layer of each of the OLEDs may not be a common layer. In some embodiments, each of the OLEDs of the plurality of OLEDs may be individually addressable. This may provide some devices with the ability to be color tunable or dimmable. In some instances a group of OLEDs (such as OLEDs that emit substantially the same color light) may be commonly addressable, but this group of OLEDs may be separately addressable from another group of OLEDs (which may comprise, for instance, OLEDs that emit different color light). In some embodiments, each of the OLEDs of the plurality of OLEDs may be commonly addressable.

In some embodiments, in the first device as described above, the first device may comprise metal foil, plastic, fabric, glass, paper or combinations thereof. That is, the substrate of the device may comprise any suitable material that is flexible. As noted above, the flexural rigidity of the device may be highly dependent on the substrate composition (as well as the encapsulation layer and perhaps the lamination layer).

In some embodiments, in the first device as described above, the first device may be configured to flutter. By "flutter," it is generally meant that the device may wave or flap rapidly in an irregular manner such as, for instance, when a force such as wind is applied to the device. Such devices, particularly when the device is a lighting device, may provide a novel and aesthetic appearance. An example of an experimental device fabricated by the inventors that flutters is shown in FIGS. 10(*a*) and (*b*) and described above. In some embodiments, the first device may comprise a fixture, and the flexible substrate may be coupled to the fixture. As noted above, a fixture may refer to any type of structure or support that the substrate may be coupled to. While a pole or a rod are potential examples of a fixture, embodiments are not so limited and could include, by way of example only, a structure such as a building or house, an antenna, table, motor vehicle, shelf, cabinet, or even a person (e.g. a person holding one end of the device and allowing it to flutter in the wind). An example of a fixture is shown in FIG. 9 and described above. In some embodiments, the first device may have a (hanging length)$^4$/flexural rigidity (a$^4$/D) ratio that is greater than 0.02 cm$^4$/dynes·cm. As noted above, the inventors have found that this value may correspond in some embodiments to devices that have at least 0.5 mm deflection in a breeze of 20 mph.

In some embodiments, in the first device as described above, the first device may be configured such that:

$$\frac{\rho}{\rho + c_m} > 1.3 Re^{-0.5} + \rho Fr + \tilde{\gamma} k^2.$$

Where Re is the Reynolds number; $\tilde{\gamma}$ is the non-dimensionalized bending rigidity, k is the non dimensionalized wavenumber; $F_r$ is the Froude number; $c_m$ is added mass coefficient.

In some embodiments, a first method may be provided. The first method may comprise the steps of providing a substrate having a first surface, disposing the substrate on a carrier, disposing an adhesive layer between at least a portion of the substrate and at least a portion of the carrier, disposing at least one organic light emitting device (OLED) over the first surface of the substrate, after disposing the at least one OLED, disposing a barrier layer over the OLED, and removing the adhesive layer from the substrate, wherein the adhesive layer has adhesive fracture energy of less than 200 J/m$^2$ when it is removed from the substrate.

As used in this context, the "adhesive fracture energy" may refer to the amount of energy required for an adhesive bond or joint to fail. There are several ways in which the adhesive bond may be broken, including, by way of example only, cohesive or interfacial. In general, it may be desirable that the adhesive is strong enough to hold the substrate in place during fabrication and deposition, but weak enough such that the substrate may be removed (i.e. decoupled) from the carrier without damaging the substrate.

The inventors have found that, in some instances, due in part to the relatively thin materials that comprise the substrate and other components of such flexible devices, it is often difficult to remove the adhesive layer from the device after the fabrication process. For example, if the adhesive fracture energy is too great, than parts of the device may be damaged when applying the necessary force to remove the adhesive layer from the substrate. The inventors have discovered that the use of achieves that have lower adhesive fracture energies and/or the use of methods of reducing the fracture energy of the adhesive after the deposition and fabrication process (such as through the application of a solution) may reduce the damage associated with the use (and removal) of an adhesive layer.

Figure 14:
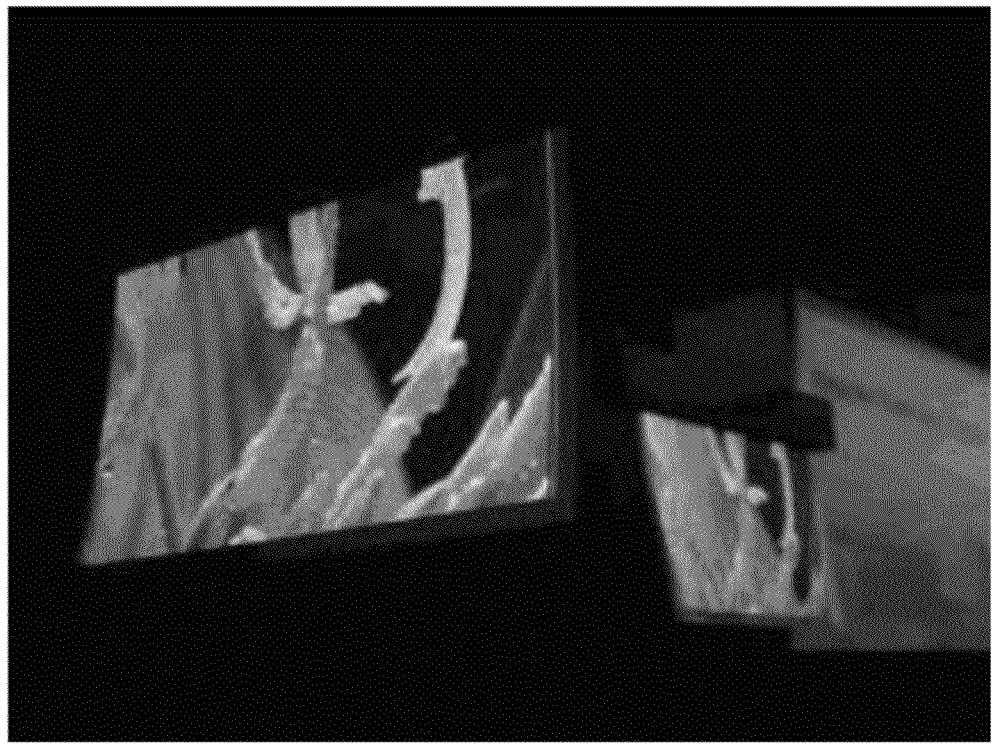
FIG. 14 discloses an AMOLED display from Samsung®.

In addition, unlike the backplane of an AMOLED display (such as the device shown in FIG. 14) that consists of TFTs prepared by Low Temperature Poly-Silicon (LTPS) process, which typically process requires temperature up to 600° C., some embodiments provided herein may not comprise TFTs and may thereby be prepared at lower temperatures. For this reason, the choice of substrates is not as limited for such devices. For example, glass and other ceramics may be suitable for use in processes that require temperatures of up to 600° C., but plastic substrates generally cannot tolerate more than 300-350° C.; similarly polymer planarization layers on metal substrates may make them unsuitable to be processed at high temperatures, though inorganic planarization layers may work but still they present other issues of surface roughness limitations.

In some embodiments, in the first method as described above, a plurality of OLEDs may be disposed over the first surface of the substrate. In some embodiments, the step of disposing the plurality of OLEDs may comprise depositing one or more organic layers through a shadow mask. That is, one or more layers of the device may be patterned. In some embodiments, the step of disposing each of the plurality of OLEDs further comprises the steps of depositing a first conductive layer of the first surface of the substrate, depositing an electro-luminescent material over the first conductive layer, and depositing a second conductive layer over the electro-luminescent material. In some embodiments, the first conductive layer may be deposited as a blanket layer. In some embodiments, the electro-luminescent material may be deposited as a patterned layer.

In some embodiments, in the first method as described above, the adhesive layer may have a glass transition temperature, and after the adhesive layer is disposed between the substrate and the carrier, the first method may further comprise the step of baking the substrate, the carrier, and the adhesive layer at a temperature that is less than the glass transition temperature of the adhesive layer.

In some embodiments, in the first method as described above where the adhesive layer has a glass transition temperature, before the adhesive layer is disposed between the substrate and the carrier, the method may further comprise the steps of disposing the adhesive layer over a portion of the carrier; and baking the carrier and the adhesive at a temperature that is less than the glass transition temperature of the adhesive layer.

In some embodiments, in the first method as described above, the step of providing the substrate may comprise planarizing the substrate. Flexible metal and plastic substrates often suffer from higher asperity count and high root mean square (RMS) surface roughness. Various planarization methods can be used, such as deposition of a resist (e.g. polyimide), followed by a hard bake, or alternatively deposition of an inorganic dielectric using methods such as PECVD.

Thus, in this regard, in some embodiments, the step of planarizing the substrate may comprise any one of: depositing a polymer over at least a portion of the first surface of the substrate and then hard baking the substrate, depositing an inorganic dielectric material over at least a portion of the first surface of the substrate, or depositing a mixture of a polymer and an inorganic dielectric material over at least a portion of the first surface of the substrate. In some embodiments, the inorganic dielectric material is deposited using chemical vapor deposition. The planarization layer may also remove electrical contact between the OLED and the substrate. This may be particularly important in the case of metal foils, where in some circumstances it may be advantageous not to have electrical current flowing through the substrate. The planarization layer may also act as a permeation barrier, which may be particularly important in the case of plastic substrates, where oxygen and moisture can permeate through the substrate. In one embodiment, the polyimide layer has a thickness of about 2 microns to about 20 microns.

In some embodiments, in the first methods as described above, the carrier may have a thermal conductivity of at least 1 W/m/K. In general, it may be preferred that the carrier have sufficient thermal conductivity such that it may absorb and/or dissipate heat from the fabrication process and thereby prevent damage to the substrate (which may comprise a relatively thin layer of material). Therefore, the choice of material and properties of the carrier may depend on the substrate characteristics.

In some embodiments, in the first method as described above, the carrier may comprise any one of, or some combination of: a metal, an alloy, a ceramic, or polymer. However, any suitable material may be used, as was noted above.

In some embodiments, in the first method as described above, the adhesive layer may have an adhesive fracture energy of less than 100 J/m$^2$ (compared to 390 J/m$^2$ being that of PI film deposited on Al substrate). That is, the fracture energy of the adhesive may be relatively low such that the bond between the carrier and the substrate may be broken without damaging the substrate or the components or layers thereon.

In some embodiments, in the first method as described above, the step of removing the adhesive layer from the substrate may comprise any one of, or some combination of: applying a force to the substrate; ablating the adhesive layer; exposing the adhesive layer to a solvent, and/or baking the adhesive. The process of ablating the adhesive layer or exposing the adhesive layer to a solvent may reduce or eliminate the adhesive facture energy such that less physical force may need to be applied to the substrate to remove it (i.e. decouple it) from the carrier. This may reduce the damage to the substrate during the process.

In some embodiments, in the first method as described above, after the barrier layer is disposed over the OLED, the first method may further comprise the step of disposing a lamination layer over the barrier layer. In some embodiments, the lamination layer may comprise any one of, or some combination of: a polymer membrane coupled to the substrate using an adhesive; a polymer layer that is thin spun-on to the barrier film; an evaporated polymer layer; or a spray coated, aerosol dispersed polymer layer disposed over the barrier film.

In some embodiments, a device may be provided. The device may comprise a substrate and one or more OLEDs disposed over the substrate where each OLED may comprise: a first electrode a second electrode; and an electro-luminescent material disposed between the first and second electrodes. The device may further include an encapsulation layer disposed over at least a part of the one or more OLEDs, and a lamination layer disposed over the encapsulation layer, where the lamination layer comprises a spray coating.

In general, the method to spray coat a device may comprise providing a substrate, growing an OLED on top of the substrate (e.g. by depositing the organic layers), followed by growing a thin barrier film, and then finally dispersing the spray coating over the encapsulation layer.

The spray coating material is usually a polymer, though in some embodiments it may be a suspension of inorganic particles in a polymer. The material can also be dispersed in a solvent. The thin barrier film (e.g. the encapsulation layer) will protect the OLED device in such a case (that is, the barrier film should prevent solvent from damaging the device). More preferably, the material is solvent-free. The material of the spray coating can be stored in a pressurized container to allow uniform dispersion. It can also be cured by leaving the device after the coat is applied at room temperature, or it can also be cured by baking, by irradiation, or through any other suitable process.

Single or multiple coats (e.g. layers) of the spray coating can be used depending on the need of surface finish or the need to obtain a necessary thickness of the spray coating. The coating can be performed by a single nozzle or multiple nozzles. An apparatus can be used to make the coating uniform over the entire area of the device.

The primary function of the spray coating in some embodiments is to provide the device some form of mechanical protection. For example, it can perform as a scratch resistant layer. It can also provide a mechanical barrier to prevent the delamination of various layers of the device, such as the organic layers, cathode, or the barrier layer from delaminating upon bending the device or upon storing the device at high temperature and/or at high humidity. Lamination allows the shift of the neutral plane in the device towards the device from the substrate thereby reducing the amount of stress the OLED and barrier film undergo upon the application of the external force.

In some instances, the spray coating may also have an optical effect on the device. For instance, the refractive index of the device or a portion thereof can be varied by varying the coating material to perform desired level of outcoupling enhancement for the device. In addition, if it forms globules or particulates of a desired size (e.g., close to a particular wavelength) or if the coating has a suspended particle of a desired size (e.g., close to a particular wavelength), the coating can also act as a scattering layer to assist the device optically.

In some embodiments, in the device as described above, the spray coating may comprise a scattering film. In some embodiments, the spray coating may comprise an aerosol dispersed polymer layer. In some embodiments, the substrate may be a flexible substrate.

In some embodiments, a method may be provided. The method may comprise the steps of providing a substrate and disposing one or more OLEDs over the substrate, wherein each OLED comprises: a first electrode; a second electrode; and an electro-luminescent material disposed between the first and second electrodes. The method may further include the steps of disposing an encapsulation layer over at least a part of the one or more OLEDs, and disposing a lamination layer over the encapsulation layer, wherein disposing the lamination layer comprises spray coating the lamination layer.

In some embodiments, the lamination layer may comprise a scattering film. In some embodiments, the lamination layer may comprise an aerosol dispersed polymer layer. In some embodiments, the substrate may comprise a flexible substrate.

Flexural Rigidity Determinations

As noted above, a useful measure of the balance between flexibility and rigidity is flexural rigidity. This is defined as the force couple required to bend a rigid structure to a unit curvature. For a uniform substrate, flexural rigidity can be described mathematically as:

$$D = Et^3/12(1-\mu^2) \quad (1)$$

Where D is flexural rigidity (in Nm), E is Young's modulus (in $Nm^{-2}$), $\mu$ is Poisson's ratio and t is the thickness of the substrate (in m). This equation is described in Rogers & Bogart, J. Mater. Res., Vol. 16, No. 1, January 2001. The more flexible the substrate, the lower the flexural rigidity. The flexural rigidity of any substrate can be theoretically calculated if Young's modulus, Poisson's ratio and the thickness of the substrate are known. However, in practice, especially when dealing with thin films, flexural rigidity may be affected by processing details, lamination of additional layers, non-uniformity across the film, etc.

Another approach may be to measure the flexural rigidity of the device. This can be done using the principle of the heavy elastica, as described in W. G. Bickley: *The Heavy Elastica*, Phil. Mag. Vol. 17 p. 603-622 (March 1934), which is hereby incorporated by reference in its entirety. A couple of specific measurement techniques are described in NASA Technical Note D-3270: *Techniques for the Measurement of the Flexural Rigidity of Thin Films and Laminates*, H. L. Price, (April 1966), which is incorporated herein by reference in its entirety. These are (1) the heart loop method and (2) the cantilever method. The heart loop method is only suitable for very thin films (typically <20 microns) with very low flexural rigidity. The cantilever method is described in detail in BS 3356:1990, British Standard Method for Determination of Bending Length and Flexural Rigidity of Fabrics, British Standards© Institution 1999, which is incorporated herein by reference.

It may be difficult to calculate flexural rigidity for thin films from material properties or from data provided in a textbook. This is especially true for composite films or multilayer films. However, once a measurement is made for a particular structure, flexural rigidity can be readily altered in a reasonably predictable way by one of skill in the art by adjusting parameters such as substrate thickness. Here we focus on the cantilever method for determining flexural rigidity. The apparatus required is a fixed angle flexometer. The basis of this measurement is to quantify the deflection of a strip of material under its own weight. The measurement technique may be used to quantify the flexural rigidity of substrates of finished devices.

A rectangular strip of material is supported on a horizontal platform in a direction perpendicular to the edge of the platform. The strip is extended in the direction of its length so that an increasing part overhangs and bends down under its own weight. When the tip of the strip of material has reached a plane passing through the edge of the platform and inclined at an angle of $\theta = 41.5°$ below the horizontal, the overhanging length L is equal to twice the bending length C of the specimen (C=0.5 L at $\theta=41.5°$).

Bending length (in m) is denoted by C, where C is the cube root of the ratio of flexural rigidity to the weight per unit area of the material: $D = WC^3$, where W is weight per unit area (in $N \cdot m^{-2}$), which for a uniform strip is given by $W = \rho tg$, such that:

$$D = WC^3 = \rho t g C^3 \quad (2)$$

Where $\rho$ is density (in $Kgm^{-3}$), g is gravitation acceleration (9.81 $ms^{-2}$) and t is the thickness of the substrate (in m). Bending length C is equal to the length of a rectangular strip of material that will bend under its own weight to an angle of 7.1° (see BS 3356:1990). Thus by measuring the overhang length L at $\theta=41.5°$, we can determine C and substitute into equation (2) to determine flexural rigidity. This result can then be compared to that using equation (1).

The method described above, where $\theta=41.5°$ and L is measured may be a preferred way to determine the flexural rigidity of a device. However, for certain materials the bending length may be prohibitively long. An alternative approach is to fix the overhang length L, and to extract $\theta$ from measurements of x and y, where $\theta=\tan^{-1}(y/x)$. Once L and $\theta$ are known, a simple look-up table (such as the one provided in Bickley 1966 and Price 1934 and provided in below in Table 1) can be used to relate bending length C to overhang length L for a given angle $\theta$, where $\theta$ ranges from 10.0° to 55.5° in steps of 0.5°. Bending length C can then be related to flexural rigidity using equation (2).

TABLE 1

Relationship between deflection angle and ratio of the bending length to the overhang length in heavy elastica cantilever tests.

| Deflection angle, θ, deg | c/l |
|---|---|
| 10.0 | 0.887 |
| 10.5 | .872 |
| 11.0 | .856 |
| 11.5 | .843 |
| 12.0 | .833 |
| 12.5 | .822 |
| 13.0 | .811 |
| 13.5 | .800 |
| 14.0 | .789 |
| 14.5 | .781 |
| 15.0 | .772 |
| 15.5 | .763 |
| 16.0 | .754 |
| 16.5 | .746 |
| 17.0 | .738 |
| 17.5 | .731 |
| 18.0 | .722 |
| 18.5 | .716 |
| 19.0 | .708 |
| 19.5 | .702 |
| 20.0 | .696 |
| 20.5 | .689 |
| 21.0 | .684 |
| 21.5 | .677 |
| 22.0 | .671 |
| 22.5 | .665 |
| 23.0 | .658 |
| 23.5 | .654 |
| 24.0 | .648 |
| 24.5 | .642 |
| 25.0 | .638 |
| 25.5 | .632 |
| 26.0 | .627 |
| 26.5 | .623 |
| 27.0 | .617 |
| 27.5 | .613 |
| 28.0 | .607 |
| 28.5 | .603 |
| 29.0 | .598 |
| 29.5 | .594 |
| 30.0 | 0.589 |
| 30.5 | .584 |
| 31.0 | .580 |
| 31.5 | .575 |
| 32.0 | .571 |
| 32.5 | .567 |
| 33.0 | .563 |
| 33.5 | .558 |
| 34.0 | .554 |
| 34.5 | .550 |
| 35.0 | .546 |
| 35.5 | .542 |
| 36.0 | .538 |
| 36.5 | .534 |
| 37.0 | .530 |
| 37.5 | .527 |
| 38.0 | .524 |
| 38.5 | .521 |
| 39.0 | .518 |
| 39.5 | .514 |
| 40.0 | .511 |
| 40.5 | .508 |
| 41.0 | .504 |
| 41.5 | .500 |
| 42.0 | .496 |
| 42.5 | .492 |
| 43.0 | .489 |
| 43.5 | .485 |
| 44.0 | .482 |
| 44.5 | .479 |
| 45.0 | .476 |
| 45.5 | .473 |
| 46.0 | .469 |
| 46.5 | .466 |
| 47.0 | .462 |
| 47.5 | .458 |
| 48.0 | .455 |
| 48.5 | .451 |
| 49.0 | .448 |
| 49.5 | .444 |
| 50.0 | 0.441 |
| 50.5 | .437 |
| 51.0 | .434 |
| 51.5 | .431 |
| 52.0 | .428 |
| 52.5 | .425 |
| 53.0 | .422 |
| 53.5 | .419 |
| 54.0 | .416 |
| 54.5 | .413 |
| 55.0 | .410 |
| 55.5 | .408 |

Finally, it should be noted that measurement of flexural rigidity could be made of a plain substrate or of a substrate onto which an OLED device has been fabricated. For substrates with relatively high flexural rigidity (e.g. 100 micron thickness stainless steel foil) the flexural rigidity of the substrate may be approximately equivalent to that of a finished device. However, the OLED device layers as well as the insulating, encapsulation and hard coat layers can add some rigidity to the substrate. This additional rigidity can be particularly important for substrate materials with relatively low flexural rigidities. It may be preferred that flexural rigidity is measured for a finished device (i.e. after the OLED and any additional layers have been deposited) according to the cantilever heavy elastic method described herein.

Composition and Fabrication of Exemplary Encapsulation Layer

Provided below are exemplary compositions (and methods of fabricating such compositions) of encapsulation layer molecules and materials that may be used in some embodiments as described above. In this regard, exemplary embodiments of materials (and deposition processes) that may be used as an edge sealant are described in detail in U.S. Pat. No. 7,968,146 entitled "Hybrid Layers for Use in Coatings on Electronic Devices or Other Articles," which is hereby incorporated by references in its entirety for all purposes. The inventors have found that the materials and methods described in U.S. Pat. No. 7,968,146, some of which are provided below, may provide films that may be preferred for use as encapsulation layer for electronic devices. However, embodiments are not limited to the molecules and methods described therein.

In this regard, and as was noted above, in some embodiments, the encapsulation film may comprise a hybrid layer comprising a mixture of a polymeric material and a non-polymeric material. The hybrid layer may have a single phase or multiple phases.

As used herein, the term "non-polymeric" may refer to a material made of molecules having a well-defined chemical formula with a single, well-defined molecular weight. A "nonpolymeric" molecule may have a significantly large molecular weight. In some circumstances, a non-polymeric molecule may include repeat units. As used herein, the term "polymeric" may refer to a material made of molecules that have repeating subunits that are covalently linked, and that has a molecular weight that may vary from molecule to molecule because the polymerizing reaction may result in different numbers of repeat units for each molecule. Polymers may include, but are not limited to, homopolymers and copolymers such as block, graft, random, or alternating copolymers, as well as blends and modifications thereof. Polymers include, but are not limited to, polymers of carbon or silicon.

As used herein, a "mixture of a polymeric material and a non-polymeric material" may refer to a composition that one of ordinary skill in the art would understand to be neither purely polymeric nor purely non-polymeric. The term "mixture" is intended to exclude any polymeric materials that contain incidental amounts of non-polymeric material (that may, for example, be present in the interstices of polymeric materials as a matter of course), but one of ordinary skill in the art would nevertheless consider to be purely polymeric. Likewise, this is intended to exclude any non-polymeric materials that contain incidental amounts of polymeric material, but one of ordinary skill in the art would nevertheless consider to be purely non-polymeric. In some cases, the weight ratio of polymeric to non-polymeric material in the hybrid layer is in the range of 95:5 to 5:95, and preferably in the range of 90:10 to 10:90, and more preferably, in the range of 25:75 to 10:90.

The polymeric/non-polymeric composition of a layer may be determined using various techniques, including wetting contact angles of water droplets, IR absorption, hardness, and flexibility. In certain instances, the hybrid layer has a wetting contact angle in the range 30° to 85°, and preferably, in the range of 30° to 60°, and more preferably, in the range of 36° to 60°. Note that the wetting contact angle is a measure of composition if determined on the surface of an as-deposited film. Because the wetting contact angle can vary greatly by post-deposition treatments, measurements taken after such treatments may not accurately reflect the layer's composition. It is believed that these wetting contact angles are applicable to a wide range of layers formed from organo-silicon precursors. In certain instances, the hybrid layer has a nano-indentation hardness in the range 3 to 20 GPa, and preferably, in the range of 10 to 18 GPa. In certain instances, the hybrid layer has a surface roughness (root-mean-square) in the range of 0.1 nm to 10 nm, and preferably, in the range of 0.2 nm to 0.35 nm. In certain instances, the hybrid layer, when deposited as a 4 mm thick layer on a 50 mm thick polyimide foil substrate, is sufficiently flexible that no microstructural changes are observed after at least 55,000 rolling cycles on a 1 inch diameter roll at a tensile strain ($\in$) of 0.2%. In certain instances, the hybrid layer is sufficiently flexible that no cracks appear under a tensile strain ($\in$) of at least 0.35% (typically a tensile strain level which would normally crack a 4 mm pure silicon oxide layer, as considered by a person of ordinary skill in the art).

It should be noted that the term "mixture" is intended to include compositions having a single phase as well as compositions having multiple phases. Therefore, a "mixture" excludes subsequently deposited alternating polymeric and non-polymeric layers. Put another way, to be considered a "mixture," a layer should be deposited under the same reaction conditions and/or at the same time.

The hybrid layer may be formed by chemical vapor deposition using a single precursor material (e.g. from a single source or multiple sources). As used herein, a "single source of precursor material" may refer to a source that provides all the precursor materials that are necessary to form both the polymeric and non-polymeric materials when the precursor material is deposited by CVD, with or without a reactant gas. This is intended to exclude methods where the polymeric material is formed using one precursor material, and the non-polymeric material is formed using a different precursor material. As would be appreciated by one of skill in the art, a "single source" of precursor material may include one or more containers (e.g. crucibles) that may be used during the process to heat or mix the chemicals that may form or contain a single precursor material. For instance, a single precursor material may be mixed or located in a plurality of containers and then vapor deposited. In general, by using a single precursor material, the deposition process may be simplified. For example, a single precursor material will obviate the need for separate streams of precursor materials and the attendant need to supply and control the separate streams.

In general, the precursor material may be a single compound or a mixture of compounds. Where the precursor material is a mixture of compounds, in some cases, each of the different compounds in the mixture is, by itself, able to independently serve as a precursor material. For example, the precursor material may be a mixture of hexamethyl disiloxane (HMDSO) and dimethyl siloxane (DMSO). Other precursors may also be utilized such as tetraethoxysilane (TEOS) or dimethyl siloxane (DMSO) or octamethylcyclotetrasiloxane orhexamethyldisilazane or other organosilanes or organosiloxanes and organosilazanes or their mixtures.

In some cases, plasma-enhanced CVD (PE-CVD) may be used for deposition of the hybrid layer. PE-CVD may be desirable for various reasons, including low temperature deposition, uniform coating formation, and controllable process parameters. Various PE-CVD processes that are suitable for use in forming a hybrid layer that may comprise a barrier layer for an edge sealant are known in the art, including those that use RF energy to generate the plasma.

The precursor material may be a material that is capable of forming both a polymeric material and a non-polymeric material when deposited by chemical vapor deposition. Various such precursor materials are suitable for use in providing a barrier film comprising a hybrid layer and may be chosen for their various characteristics. For example, a precursor material may be chosen for its content of chemical elements, its stoichiometric ratios of the chemical elements, and/or the polymeric and non-polymeric materials that are formed under CVD. For instance, organo-silicon compounds, such as siloxanes, are a class of compounds suitable for use as the precursor material. Representative examples of siloxane compounds include hexamethyl disiloxane (HMDSO) and dimethyl siloxane (DMSO). When deposited by CVD, these siloxane compounds are able to form polymeric materials, such as silicone polymers, and non-polymeric materials, such as silicon oxide. The precursor material may also be chosen for various other characteristics such as cost, non-toxicity, handling characteristics, ability to maintain liquid phase at room temperature, volatility, molecular weight, etc.

Other organo-silicon compounds suitable for use as a precursor material include methylsilane; dimethylsilane; vinyl trimethylsilane; trimethylsilane; tetramethylsilane; ethylsilane; disilanomethane; bis(methylsilano)methane; 1,2-disilanoethane; 1,2-bis(methylsilano)ethane; 2,2-disilanopropane; 1,3,5-trisilano-2,4,6-trimethylene, and fluorinated derivatives of these compounds. Phenyl-containing organo-silicon compounds suitable for use as a precursor material include: dimethylphenylsilane and diphenylmethylsilane. Oxygen containing organo-silicon compounds suitable for use as a precursor material include: dimethyldimethoxysilane; 1,3,5,7-tetramethylcyclotetrasiloxane; 1,3-dimethyldisiloxane; 1,1,3,3-tetramethyldisiloxane; 1,3-bis(silanomethylene)disiloxane; bis(1-methyldisiloxanyl)methane; 2,2-bis(1-methyldisiloxanyl)propane; 2,4,6,8-tetramethylcyclotetrasiloxane; octamethylcyclotetrasiloxane; 2,4,6,8,10-pentamethylcyclopentasiloxane; 1,3,5,7-tetrasilano-2,6-dioxy-4,8-dimethylene; hexamethylcyclotrisiloxane; 1,3,5,7,9-pentamethylcyclopentasiloxane; hexamethoxydisiloxane, and fluorinated derivatives of these compounds. Nitrogen-containing organosilicon compounds suitable for use as a precursor material include: hexamethyldisilazane; divinyltetramethyldisilizane; hexamethylcyclotrisilazane; dimethylbis(N-methylacetamido) silane; dimethylbis-(N-ethylacetamido)silane; methylvinylbis(N-methylacetamido)silane; methylvinylbis (Nbutylacetamido)silane; methyltris(N-phenylacetamido) silane; vinyltris(N-ethylacetamido)silane; tetrakis (Nmethylacetamido)silane; diphenylbis(diethylaminoxy) silane; methyltris(diethylaminoxy)silane; and bis (trimethylsilyl)carbodiimide.

When deposited by CVD, the precursor material may form various types of polymeric materials in various amounts, depending upon the type of precursor material, the presence of any reactant gases, and other reaction conditions. The polymeric material may be inorganic or organic. For example, where organo-silicon compounds are used as the precursor material, the deposited hybrid layer may include polymer chains of Si—O bonds, Si—C bonds, or Si—O—C bonds to form polysiloxanes, polycarbosilanes, and polysilanes, as well as organic polymers.

When deposited by CVD, the precursor material may form various types of non-polymeric materials in various amounts, depending upon the type of precursor material, the presence of any reactant gases, and other reaction conditions. The non-polymeric material may be inorganic or organic. For example, where organo-silicon compounds are used as the precursor material in combination with an oxygen-containing reactant gas, the non-polymeric material may include silicon oxides, such as SiO, $SiO_2$, and mixed-valence oxides $SiO_x$. When deposited with a nitrogen-containing reactant gas, the non-polymeric material may include silicon nitrides ($SiN_x$). Other non-polymeric materials that may be formed in some instances include silicon oxycarbide and silicon oxynitrides.

When using PE-CVD, the precursor material may be used in conjunction with a reactant gas that reacts with the precursor material in the PE-CVD process. The use of reactant gases in PE-CVD is known in the art and various reactant gases are suitable for use in the present invention, including oxygen containing gases (e.g., $O_2$, ozone, water) and nitrogen-containing gases (e.g., ammonia). The reactant gas may be used to vary the stoichiometric ratios of the chemical elements present in the reaction mixture. For example, when a siloxane precursor material is used with an oxygen or nitrogen-containing reactant gas, the reactant gas will change the stoichiometric ratios of oxygen or nitrogen in relation to silicon and carbon in the reaction mixture. This stoichiometric relation between the various chemical elements (e.g., silicon, carbon, oxygen, nitrogen) in the reaction mixture may be varied in several ways. One way is to vary the concentration of the precursor material or the reactant gas in the reaction. Another way is to vary the flow rates of the precursor material or the reactant gas into the reaction. Another way is to vary the type of precursor material or reactant gas used in the reaction.

Changing the stoichiometric ratios of the elements in the reaction mixture can affect the properties and relative amounts of the polymeric and non-polymeric materials in the deposited hybrid layer. For example, a siloxane gas may be combined with varying amounts of oxygen to adjust the amount of non-polymeric material relative to the polymeric material in the hybrid layer. By increasing the stoichiometric ratio of oxygen in relation to the silicon or carbon, the amount of non-polymeric material, such as silicon oxides, may be increased. Similarly, by reducing the stoichiometric ratio of oxygen, the amount of silicon and carbon-containing polymeric material may be increased. The composition of the hybrid layer may also be varied by adjusting other reaction conditions. For example, in the case of PE-CVD, process parameters such as RF power and frequency, deposition pressure, deposition time, and gas flow rates can be varied.

Thus, by using the exemplary methods as described above, it is possible to form a hybrid layer of hybrid polymeric/non-polymeric character and having characteristics suitable for use in various applications, particular as a barrier film to reduce edge ingress of permeates. Such characteristics of the barrier film may include optical transparency (e.g., in some cases, the hybrid layer may be optically transparent or semi-transparent), impermeability, flexibility, thickness, adhesion, and other mechanical properties. For example, one or more of these characteristics may be adjusted by varying the weight % of polymeric material in the hybrid layer, with the remainder being non-polymeric material. For instance, to achieve a desired level of flexibility and impermeability, the wt % of polymeric material may preferably be in the range of 5 to 95%, and more preferably in the range of 10 to 25%. However, other ranges are also possible depending upon the application.

CONCLUSION

It is understood that the various embodiments described herein are by way of example only, and are not intended to limit the scope of the invention. For example, many of the materials and structures described herein may be substituted with other materials and structures without deviating from the spirit of the invention. The present invention as claimed may therefore include variations from the particular examples and preferred embodiments described herein, as will be apparent to one of skill in the art. It is understood that various theories as to why the invention works are not intended to be limiting.

The above description is illustrative and is not restrictive. Many variations of the invention will become apparent to those skilled in the art upon review of the disclosure. The scope of the invention should, therefore, be determined not with reference to the above description, but instead should be determined with reference to the pending claims along with their full scope or equivalents.

Although many embodiments were described above as comprising different features and/or combination of features, a person of ordinary skill in the art after reading this disclosure may understand that in some instances, one or more of these components could be combined with any of the components or features described above. That is, one or more features from any embodiment can be combined with one or more features of any other embodiment without departing from the scope of the invention.

As noted previously, all measurements, dimensions, and materials provided herein within the specification or within the figures are by way of example only.

A recitation of "a," "an," or "the" is intended to mean "one or more" unless specifically indicated to the contrary. Reference to a "first" component does not necessarily require that a second component be provided. Moreover reference to a "first" or a "second" component does not limit the referenced component to a particular location unless expressly stated.

All publications mentioned herein are incorporated herein by reference to disclose and describe the methods and/or materials in connection with which the publications are cited. The publications discussed herein are provided solely for their disclosure prior to the filing date of the present application. Nothing herein is to be construed as an admission that the present invention is not entitled to antedate such publication by virtue of prior invention. Further, the dates of publication provided may be different from the actual publication dates, which may need to be independently confirmed.

What is claimed is:

1. A first device, comprising:
a flexible substrate; and
at least one organic light emitting device (OLED) disposed over the flexible substrate;
wherein the first device has a flexural rigidity between $10^{-1}$ Nm and $10^{-6}$ Nm;
wherein the ratio of the critical strain energy release rate to the material density factor for the first device is greater than 0.05 J m/Kg; and
wherein the first device is configured to have each of axial, bending and torsional degrees of freedom.

2. The first device of claim 1, wherein the substrate can tolerate a strain of at least 0.5% without breaking.

3. The first device of claim 1, wherein the flexible substrate is attached to a fixture via one or more points of attachment, and wherein there exists a line drawn through the geometric center of the device such that all points of attachment to the fixture fall on the same side of the line.

4. The first device of claim 1, wherein the substrate comprises any one of:
a plastic material having a thickness between 30 μm and 5 mm;
a fabric material having a thickness between 30 μm and 1.6 mm;
a metal material having a thickness between 14 μm and 300 μm;
a paper material having a thickness between 30 μm and 1.6 mm;
aluminum sheet having a thickness between 30 μm and 300 μm;
stainless sheet steel having a thickness between 20 μm and 150 μm;
copper sheet having a thickness between 25 μm and 250 μm;
polyethylene sheet having a thickness between 200 μm and 2 mm;
polyethylene terephthalate sheet having a thickness between 55 μm and 1 mm; and
polyethylene naphthalate sheet having a thickness between 50 μm and 0.72 mm.

5. The first device of claim 1, wherein the first device further comprises a barrier layer that encapsulates each of the OLEDs disposed on the substrate, and comprising a less than 10 micron thick mixture of polymeric material and non-polymeric material.

6. The first device of claim 1, wherein each of the one or more OLEDs comprises a first electrode, a second electrode, and an organic electro-luminescent material disposed between the first electrode and the second electrode.

7. The first device of claim 1, wherein the first device has a global dimension-to-thickness ratio greater than 10.

8. The first device of claim 1,
wherein the OLED comprises a first electrode and a second electrode;
wherein the first electrode is disposed closer to the substrate than the second electrode; and
wherein the first electrode is in direct contact with the surface of the substrate.

9. The first device of claim 1,
wherein the OLED comprises a first electrode and a second electrode;
wherein the first electrode is disposed closer to the substrate than the second electrode; and
wherein at least one layer is present between the first electrode of the OLED and the surface of the substrate.

10. The first device of claim 9, wherein the first device comprises an insulator disposed between the first electrode of the OLED and the substrate; the insulator comprising one of: a polymer, an inorganic dielectric, and a mixture of a polymer and an inorganic dielectric.

11. The first device of claim 1, wherein the first device is configured to not have shear degree of freedom.

12. The first device of claim 1, wherein the first device is configured to deform non-linearly under an applied load.

13. The first device of claim 1, wherein the first device is configured to flutter.

14. The first device of claim 13 a fixture, and wherein the flexible substrate is coupled to the fixture.

15. The first device of claim 13, wherein the first device has a ratio of the (hanging length)$^4$ to flexural rigidity ($a^4$/D) of at least 0.02 cm$^4$/dynes.cm.

16. The first device of claim 1, wherein the first device is configured such that $$\frac{p}{p+c_m} > 1.3 R_e^{-0.5} + \rho F_r + \overline{\gamma} k^2.$$

17. A device, comprising:
a substrate;
one or more OLEDs disposed over the substrate,
wherein each OLED comprises: a first electrode; a second electrode; and an electro-luminescent material disposed between the first and second electrodes;
an encapsulation layer disposed over at least a part of the one or more OLEDs; and
a lamination layer comprises a spray coating that is sprayed over the encapsulation layer and the one or more OLED.

18. A first device, comprising:
a flexible substrate; and
at least one organic light emitting device (OLED) disposed over the flexible substrate;
wherein the first device has a flexural rigidity between $10^{-1}$ Nm and $10^{-6}$ Nm;
wherein the ratio of the critical strain energy release rate to the material density factor for the first device is greater than 0.05 J m/Kg; and wherein the first device is configured not to have shear degree freedom.

19. A first device, comprising:
a flexible substrate; and
at least one organic light emitting device (OLED) disposed over the flexible substrate;
wherein the first device has a flexural rigidity between $10^{-1}$ Nm and $10^{-6}$ Nm;
wherein the ratio of the critical strain energy release rate to the material density factor for the first device is greater than 0.05 J m/Kg; and
wherein the first device is configured to deform non-linearly under an applied load.

20. A first device, comprising:
a flexible substrate; and
at least one organic light emitting device (OLED) disposed over the flexible substrate;
wherein the first device has a flexural rigidity between $10^{-1}$ Nm and $10^{-6}$ Nm;
wherein the ratio of the critical strain energy release rate to the material density factor for the first device is greater than 0.05 J m/Kg; and
wherein the first device has a ratio of the (hanging length)$^4$ to flexural rigidity ($a^4/D$) of at least 0.02 cm$^4$/dynes.cm.

21. A first device, comprising:
a flexible substrate; and
at least one organic light emitting device (OLED) disposed over the flexible substrate;
wherein the first device has a flexural rigidity between $10^{-1}$ Nm and $10^{-6}$ Nm;
wherein the ratio of the critical strain energy release rate to the material density factor for the first device is greater than 0.05 J m/Kg; and
wherein the first device is configured such that $$\frac{p}{p+c_m} > 1.3 R_e^{-0.5} + \rho F_r + \overline{y}k^2.$$

* * * * *